United States Patent
Nakada

(10) Patent No.: US 6,653,870 B2
(45) Date of Patent: Nov. 25, 2003

(54) SIGNAL DETECTION CIRCUIT, DATA TRANSFER CONTROL DEVICE AND ELECTRONIC EQUIPMENT

(75) Inventor: Akira Nakada, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/142,047

(22) Filed: May 10, 2002

(65) Prior Publication Data

US 2002/0167341 A1 Nov. 14, 2002

(30) Foreign Application Priority Data

May 14, 2001 (JP) ........................................ 2001-143635

(51) Int. Cl.[7] .............................................. H03L 5/153
(52) U.S. Cl. .............................. 327/58; 327/59; 327/60
(58) Field of Search ............................... 327/17, 50, 58, 327/60, 63, 65, 72, 77, 78, 91, 94; 359/198; 363/95

(56) References Cited

U.S. PATENT DOCUMENTS 5,790,295 A * 8/1998 Devon .......................... 359/189
6,366,484 B1 * 4/2002 Jin ................................ 363/95

OTHER PUBLICATIONS

U.S. patent application Ser. No. 10/142,030, Nakada et al., filed May 10, 2002.
U.S. patent application Ser. No. 10/142,333, Nakada, filed May 10, 2002.
U.S. patent application Ser. No. 10/142,066, Nakada et al., filed May 10, 2002.

* cited by examiner

Primary Examiner—Tuan T. Lam
Assistant Examiner—Hiep Nguyen
(74) Attorney, Agent, or Firm—Oliff & Berridge, PLC

(57) ABSTRACT

There is provided a signal detection circuit capable of detecting a signal at a high speed having small amplitude, and a data transfer control device and electronic equipment using the same. The signal detection circuit includes a peak hold circuit, a constant potential setting circuit, and a comparison circuit. The peak hold circuit holds a peak value of an input signal at a given node. The constant potential setting circuit always returns the potential at the given node changed by holding the peak value by the peak hold circuit to a constant potential at a time constant greater than the potential change caused by holding the peak value. The comparison circuit compares the potential at the node at which the peak value is held and which is slowly returned to the constant potential with a given reference level, and outputs the comparison result as a detection signal.

18 Claims, 12 Drawing Sheets

FIG. 9

| |DP-DM| | XIQ | HS_SQLENB | HS_SQ |
|---|---|---|---|
| X | X | L | L |
| X | L | X | L |
| <|WP-WZ| | H | H | L |
| >|WP-WZ| | H | H | H |

SIGNAL DETECTION CIRCUIT, DATA TRANSFER CONTROL DEVICE AND ELECTRONIC EQUIPMENT

Japanese Patent Application No. 2001-143635, filed on May 14, 2001, is hereby incorporated by reference in its entirety.

TECHNICAL FIELD

The present invention relates to a signal detection circuit, and a data transfer control device and electronic equipment using the same.

BACKGROUND

The universal serial bus (USB) standard has recently attracted attention as an interface standard for connections between personal computers and peripheral equipment (broadly speaking: electronic equipment). This USB standard has the advantage of enabling the use of connectors of the same standard to connect peripheral equipment such as a mouse, keyboard, and printer, which are connected by connectors of different standards in the prior art, and of making it possible to implement plug-and-play and hot-plug features.

In comparison with the IEEE 1394 standard, which is also attracting notice as a standard for the same serial bus interface, this USB standard has a problem in that the transfer speed thereof is slower.

Under such circumstances, the USB 2.0 standard was established and is attracting attention, USB 2.0 allowing a data transfer speed of 480 Mbps (High Speed (HS) mode) which is much faster than the speed achievable according to the USB 1.1 standard while maintaining backward compatibility with the USB 1.1 standard. USB 2.0 Transceiver Macrocell Interface (UTMI) was also established in which specifications for interfaces for physical layer circuits and logical layer circuits according to USB 2.0 were defined.

SUMMARY

According to one aspect of the present invention, there is provided a signal detection circuit which detects an input signal, comprising:

a peak hold circuit which holds a peak value of the input signal at a given node;

a constant potential setting circuit which returns a potential at the node to a given constant potential; and a comparison circuit which compares the potential at the node with a given reference level, wherein the signal detection circuit detects the input signal based on a comparison result by the comparison circuit.

According to another aspect of the present invention, there is also provided a signal detection circuit which detects a differential pair of input signals, comprising:

a differential amplifier which outputs a differential pair of output signals which are amplified based on the differential pair of input signals;

first and second peak hold circuits which hold peak values of the differential pair of output signals at a given node;

a constant potential setting circuit which returns the potential at the node to a given constant potential such that the potential changes slower than a potential change caused by holding the peak values; and a comparison circuit which compares the potential at the node with a given reference level, wherein the signal detection circuit detects the input signals based on a comparison result by the comparison circuit.

BRIEF DESCRIPTION OF THE DRAWINGS

FIG. 9 is a truth table representing the operation of the HS_SQ circuit for high speed in the embodiment;

DETAILED DESCRIPTION

Figure 1:
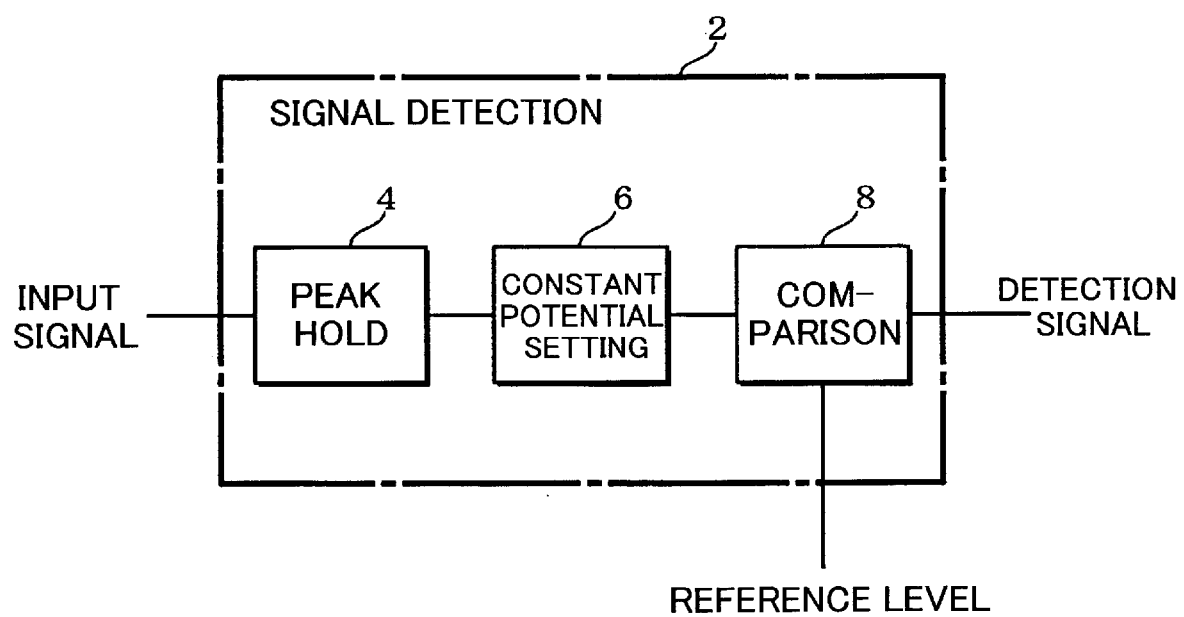
FIG. 1 is a fundamental configuration diagram of a signal detection circuit according to an embodiment of the invention.

According to USB 2.0, the transfer mode called HS mode is available in addition to the Full Speed (FS) mode conventionally defined in USB 1.1. Since data transfer is performed at 480 Mbps in the HS mode, data transfer can be achieved at a speed much higher than that in the FS mode in which data transfer is performed at 12 Mbps. According to USB 2.0, it is therefore possible to provide interfaces that are most suitable for storage apparatus such as hard disk drives and optical disk drives which must have a high transfer speed.

According to USB 2.0, however, a signal having small amplitude must be detected as a reception signal that is faster than ever. Therefore, when a signal detection circuit is constituted by an envelope detection circuit as seen in the past, a problem arises in that it is difficult to achieve satisfactory frequency characteristics even if currently available costly fine processes are used. There is another problem in that it is difficult to detect reception of a signal having small amplitude with such an envelope detection circuit.

The following embodiments were conceived taking the above technical problems into consideration, and the following embodiments make it possible to provide a signal detection circuit that can detect and receive a signal at a high speed having small amplitude even with low cost processes and to provide a data transfer control device and electronic equipment using the same.

One embodiment of the present invention relates to a signal detection circuit which detects an input signal, comprising:

a peak hold circuit which holds a peak value of the input signal at a given node;

a constant potential setting circuit which returns a potential at the node to a given constant potential; and a comparison circuit which compares the potential at the node with a given reference level, wherein the signal detection circuit detects the input signal based on a comparison result by the comparison circuit.

While a peak value in this context is a peak value of a potential for example, it may be a higher limit value or a lower limit value of the same.

According to this embodiment, a peak value of an input signal is held at a given node to be returned to a given constant potential, and a potential at the node at which the peak value is held is compared with a given reference level. This makes it possible to detect the presence of an input signal at a high speed having small amplitude without relying on fine processing techniques.

Another embodiment of the present invention relates to a signal detection circuit which detects a differential pair of input signals, comprising:

a differential amplifier which outputs a differential pair of output signals which are amplified based on the differential pair of input signals;

first and second peak hold circuits which hold peak values of the differential pair of output signals at a given node;

a constant potential setting circuit which returns the potential at the node to a given constant potential such that the potential changes slower than a potential change caused by holding the peak values; and a comparison circuit which compares the potential at the node with a given reference level, wherein the signal detection circuit detects the input signals based on a comparison result by the comparison circuit.

A potential change caused by holding peak values is a change in the potential caused by the first or second peak hold circuit. More specifically, it is a potential change caused by the first or second peak hold circuit when the first or second peak hold circuit changes the potential upward or downward in order to hold the peak value.

In this embodiment, peak values of the differential pair of input signals are held at the same node by the first and second peak hold circuits. The node is returned to a given constant potential such that the potential changes slower than a potential change caused by holding the peak values by the first and second peak hold circuits. This makes it possible to continuously detect the presence of input signals at a higher speed having smaller amplitude by comparing the potential at the node with the given reference level.

In this signal detection circuit, the first and second peak hold circuits may hold lower limit values of the differential pair of output signals at the given node, and the constant potential setting circuit may return the potential at the node to the given constant potential by supplying charges to the node such that the potential changes slower than a potential change caused by holding the lower limit values.

According to this configuration, lower limit values of a differential pair of input signals are held at the same node by the first and second peak hold circuits. The node is returned to the given constant potential such that the potential changes slower than the potential change caused by holding the lower limit values by the first and second peak hold circuits. This makes it possible to continuously detect the presence of an input signal at a higher speed having smaller amplitude by comparing the potential at the node and a given reference level. In particular, since discharging is performed to hold the lower limit values, the high speed response performance of the first and second peak hold circuits is improved compared to that in the case in which charging is performed, which makes it possible to detect the presence of an input signal at a higher speed having smaller amplitude.

In the signal detection circuit, the constant potential setting circuit may comprise a constant current source which supplies small amount of charges which cause a change slower than the potential change by holding the lower limit values.

According to this configuration, since the constant current source constitutes the constant potential setting circuit which returns the potential for holding the lower limit values to the given constant potential, the high speed response performance of the first and second peak hold circuits can be improved to make it possible to detect the presence of an input signal at a higher speed having smaller amplitude with a simple configuration and without relying on fine processing techniques.

In the signal detection circuit, the differential amplifier may comprise:

a first transistor of a first conductivity type having a source terminal connected to a first power source;

a second transistor of the first conductivity type having a source terminal connected to a drain terminal of the first transistor of the first conductivity type;

a third transistor of the first conductivity type having a source terminal connected to the drain terminal of the first transistor of the first conductivity type;

a first transistor of a second conductivity type having gate and drain terminals connected to a drain terminal of the second transistor of the first conductivity type and having a source terminal connected to a second power source; and a second transistor of the second conductivity type having gate and drain terminals connected to a drain terminal of the third transistor of the first conductivity type and having a source terminal connected to the second power source, wherein a given enable signal may be supplied to a gate terminal of the first transistor of the first conductivity type, wherein the differential pair of input signals may be supplied to gate terminals of the second and third transistors of the first conductivity type, and wherein the differential pair of output signals may be output from drain terminals of the first and second transistors of the second conductivity type.

According to this configuration, since the differential amplifier which outputs a differential pair of output signals in accordance with a differential pair of input signals is provided with a simple configuration, there is no need for relying upon costly fine processing techniques, which makes it possible to reduce the cost of the signal detection circuit capable of detecting the presence of a differential pair of reception signals at a high speed having small amplitude.

In the signal detection circuit, at least either of the first and second peak hold circuits may comprise:

a fourth transistor of a first conductivity type having a source terminal connected to a first power source;

a fifth transistor of the first conductivity type having a source terminal connected to a drain terminal of the fourth transistor of the first conductivity type;

a sixth transistor of the first conductivity type having a source terminal connected to the drain terminal of the fourth transistor of the first conductivity type;

a third transistor of a second conductivity type having a drain terminal connected to a drain terminal of the fifth transistor of the first conductivity type, having a gate terminal connected to a drain terminal of the sixth transistor of the first conductivity type, and having a source terminal connected to a second power source;

a fourth transistor of the second conductivity type having gate and drain terminals connected to the drain terminal of the sixth transistor of the first conductivity type and having a source terminal connected to the second power source; and a fifth transistor of the second conductivity type having a drain terminal connected to a gate terminal of the sixth transistor of the first conductivity type, having a gate terminal connected to the drain terminal of the third transistor of the second conductivity type, and having a source terminal connected to the second power source, wherein a given enable signal may be supplied to a gate terminal of the fourth transistor of the first conductivity type, wherein either of the differential pair of output signals may be supplied to a gate terminal of the fifth transistor of the first conductivity type, and wherein the node may be connected to the gate terminal of the sixth transistor of the first conductivity type.

According to this configuration, since the charges at the node which holds peak values of a differential pair of input signals are discharged by the fifth transistor of the second conductivity type, a higher response can be achieved compared to that in the case of charging the same, and this makes it possible to significantly improve the property of following up a change in an input signal at a high speed having small amplitude.

In the signal detection circuit, the comparison circuit may comprise:

a seventh transistor of a first conductivity type having a source terminal connected to a first power source;

an eighth transistor of the first conductivity type having a source terminal connected to a drain terminal of the seventh transistor of the first conductivity type;

a ninth transistor of the first conductivity type having a source terminal connected to the drain terminal of the seventh transistor of the first conductivity type;

a sixth transistor of a second conductivity type having gate and drain terminals connected to a drain terminal of the eighth transistor of the first conductivity type and having a source terminal connected to a second power source;

a seventh transistor of the second conductivity type having a drain terminal connected to a drain terminal of the ninth transistor of the first conductivity type, having a gate terminal connected to the gate terminal of the sixth transistor of the second conductivity type, and having a source terminal connected to the second power source; and an eighth transistor of the second conductivity type having a drain terminal connected to the gate terminal of the sixth transistor of the second conductivity type, having a gate terminal connected to the drain terminal of the seventh transistor of the second conductivity type, and having a source terminal connected to the second power source, wherein a given enable signal may be supplied to a gate terminal of the seventh transistor of the first conductivity type, wherein the node may be connected to a gate terminal of the eighth transistor of the first conductivity type, wherein a signal of the reference level may be supplied to a gate terminal of the ninth transistor of the first conductivity type, and wherein the comparison result may be output from the drain terminal of the seventh transistor of the second conductivity type.

According to this configuration, the comparison circuit which compares the potential at the node for holding peak values of input signals with the reference level for detecting whether there is an input signal is constituted by an operational amplifier having a simple configuration formed by transistors. This eliminates the need for relying upon costly fine processing techniques and makes it possible to reduce the cost of the signal detection circuit capable of detecting the presence of a differential pair of reception signals at a high speed having small amplitude.

The signal detection circuit may comprise a reference level generation circuit including:

a tenth transistor of the first conductivity type having a source terminal connected to the first power source;

an eleventh transistor of the first conductivity type having a source terminal connected to a drain terminal of the tenth transistor of the first conductivity type;

a twelfth transistor of the first conductivity type having a source terminal connected to the drain terminal of the tenth transistor of the first conductivity type;

a ninth transistor of the second conductivity type having gate and drain terminals connected to a drain terminal of the eleventh transistor of the first conductivity type and having a source terminal connected to the second power source; and a tenth transistor of the second conductivity type having gate and drain terminals connected to a drain terminal of the twelfth transistor of the first conductivity type and having a source terminal connected to the second power source, wherein a given enable signal may be supplied to a gate terminal of the tenth transistor of the first conductivity type, wherein a differential pair of detection level signals associated with levels to be detected may be respectively supplied to gate terminals of the eleventh and twelfth transistors of the first conductivity type, wherein a signal of the reference level may be output from the drain terminal of the tenth transistor of the second conductivity type, and wherein the reference level generation circuit may have electrical characteristics substantially equal to the differential amplifier.

The electrical characteristics include at least temperature characteristics.

According to this configuration, since the reference level generation circuit which generates a signal of the reference level for detecting the presence of a differential pair of input signals is constituted by an operational amplifier having a simple configuration formed by transistors, the cost of the signal detection circuit can be reduced. In addition, the reference level generation circuit is configured to have electrical characteristics substantially equal to the differential amplifier for generating a differential pair of output signals having peak values held at a node based on a differential pair of input signals. This makes it possible to generate a signal of an appropriate reference level in accordance with the differential pair of output signals which changes depending on the environment of operation and to improve the accuracy of signal detection performed by the signal detection circuit. For example, by providing the differential amplifier and the reference level generation circuit with transistors in the same configuration and size, they can be easily configured with similar electrical characteristics.

In the signal detection circuit, the constant potential setting circuit may comprise:

a thirteenth transistor of a first conductivity type having a source terminal connected to a first power source and having a drain terminal connected to the node; and a capacitor inserted between the node and a second power source, wherein a given enable signal may be supplied to a gate terminal of the thirteenth transistor of the first conductivity type.

Since a configuration is employed in which a peak value is held at the capacitor and in which the node that is connected to one end of the capacitor is connected to the first power source through the thirteenth transistor of the first conductivity type, the constant potential setting circuit can be simplified to allow simplification of the signal detection circuit. This eliminates the need for relying upon costly fine processing techniques and to reduce the cost of the signal detection circuit capable of detecting the presence of a differential pair of reception signals at a high speed having small amplitude.

The signal detection circuit may comprise an output circuit including:

a fourteenth transistor of a first conductivity type having a source terminal connected to a first power source; and an eleventh transistor of a second conductivity type having a drain terminal connected to a drain terminal of the fourteenth transistor of the first conductivity type and having a source terminal connected to a second power source, wherein a given enable signal may be supplied to a gate terminal of the fourteenth transistor of the first conductivity type, wherein an output signal from the comparison circuit may be supplied to a gate terminal of the eleventh transistor of the second conductivity type, and wherein a signal at a logical level associated with the output signal of the comparison circuit may be output from the drain terminal of the eleventh transistor of the second conductivity type.

In the signal detection circuit, a configuration is employed which includes an output circuit which outputs a signal at a logical level associated with the output signal of the comparison circuit to a logic circuit connected downstream of the signal detection circuit, for example. This makes it possible to perform a complicated process easily based on whether there is an input signal at a high speed having small amplitude.

In the signal detection circuit, the differential pair of input signals may be signals in accordance with the Universal Serial Bus (USB) standard.

This configuration makes it possible to achieve data transfer at a speed as high as 480 Mbps in the HS mode that is standardized in USB 2.0.

According to further embodiment of the present invention, there is provided a data transfer control device comprising:

one of the above-described signal detection circuit; and a circuit which performs a given receiving process based on a signal detected by the signal detection circuit.

This embodiment makes it possible to provide a data transfer control device capable of detecting a reception signal at a high speed having small amplitude and makes it possible to easily perform data transfer at a high speed between a personal computer and peripheral equipment, for example.

According to still another embodiment of the present invention, there is provided electronic equipment comprising the above-described data transfer control device and a device which performs a process of outputting, fetching or storing data transferred through the data transfer control device and a bus.

This embodiment allows a data transfer control device used in electronic equipment to perform high speed transfer, thereby increasing the speed of data processing.

These embodiments of the invention will now be described in detail with reference to the drawings.

1. Signal Detection Circuit

FIG. 1 shows a fundamental configuration diagram of a signal detection circuit according to an embodiment of the invention.

A signal detection circuit 2 includes a peak hold circuit 4, a constant potential setting circuit 6, and a comparison circuit 8.

The peak hold circuit 4 holds a peak value of an input signal at a given node.

The constant potential setting circuit 6 returns the potential at the given node that changes when the peak value is held by the peak hold circuit 4 to a given constant potential. In doing so, the constant potential setting circuit 6 can return the potential to the constant potential at a time constant greater than that of the potential change attributable to the retention of the peak value. A potential change attributable to the retention of the peak value is a potential change caused by the peak hold circuit 4. More specifically, it is a potential change caused by the peak hold circuit 4 when the peak hold circuit 4 changes the potential upward or downward in order to hold the peak value. For example, such a constant potential setting circuit 6 can be constituted by a circuit that continues to supply very small charges to the node from a constant current source.

The comparison circuit 8 compares the potential at the node at which the peak value is held and which is slowly returned to the constant potential with a give reference potential and outputs the result of comparison as a detection signal. Since it is possible to judge whether the potential at the node is higher than the given reference potential from the detection signal, the presence of the input signal can be detected.

Thus, according to the present embodiment, a peak value of an input signal is held at a node that is returned to a constant potential at a certain time constant, and the potential at the node is compared with a given reference level. This allows the signal detection circuit 2 to detect a potential change at the node in accordance with the peak value held and makes it possible to judge the presence of an input signal at a high speed having very small amplitude.

Such a signal detection circuit according to the present embodiment will now be specifically described with reference to use of the same according to Universal Serial Bus (USB) 2.0.

2. USB 2.0

According to USB 2.0, a plurality of peripheral equipment in compliance with USB 1.1 or USB 2.0 can be connected to a personal computer as a host machine that manages a bus with the intervention of a hub machine.

Such a host machine is loaded with a host controller in compliance with USB 2.0. The host controller judges which of USB 1.1 and USB 2.0 the connected apparatus comply to and controls data transfer through the bus accordingly.

The hub machine is loaded with a hub controller in compliance with USB 2.0, for example. The hub controller judges which of USB 1.1 and USB 2.0 the connected peripheral equipment comply to and controls the bus transfer system accordingly.

The peripheral equipment is loaded with a device controller that is also in compliance with USB 1.1 or USB 2.0. For example, when a device controller is in compliance with USB 2.0, the device controller includes physical layer circuits in compliance with USB 1.1 and USB 2.0 interface specifications and logic layer circuits that control data transfer in accordance with the peripheral equipment in which the controller is loaded.

A signal detection circuit of the present embodiment may be used in a USB 2.0 physical layer circuit included in a data transfer control device such as a host controller, hub controller or device controller that performs data transfer as defined in USB 2.0 through a bus, and it can perform a process of detecting a reception signal in conformity to USB 2.0 specifications.

2.1 Data Transfer Control Device

Figure 2:
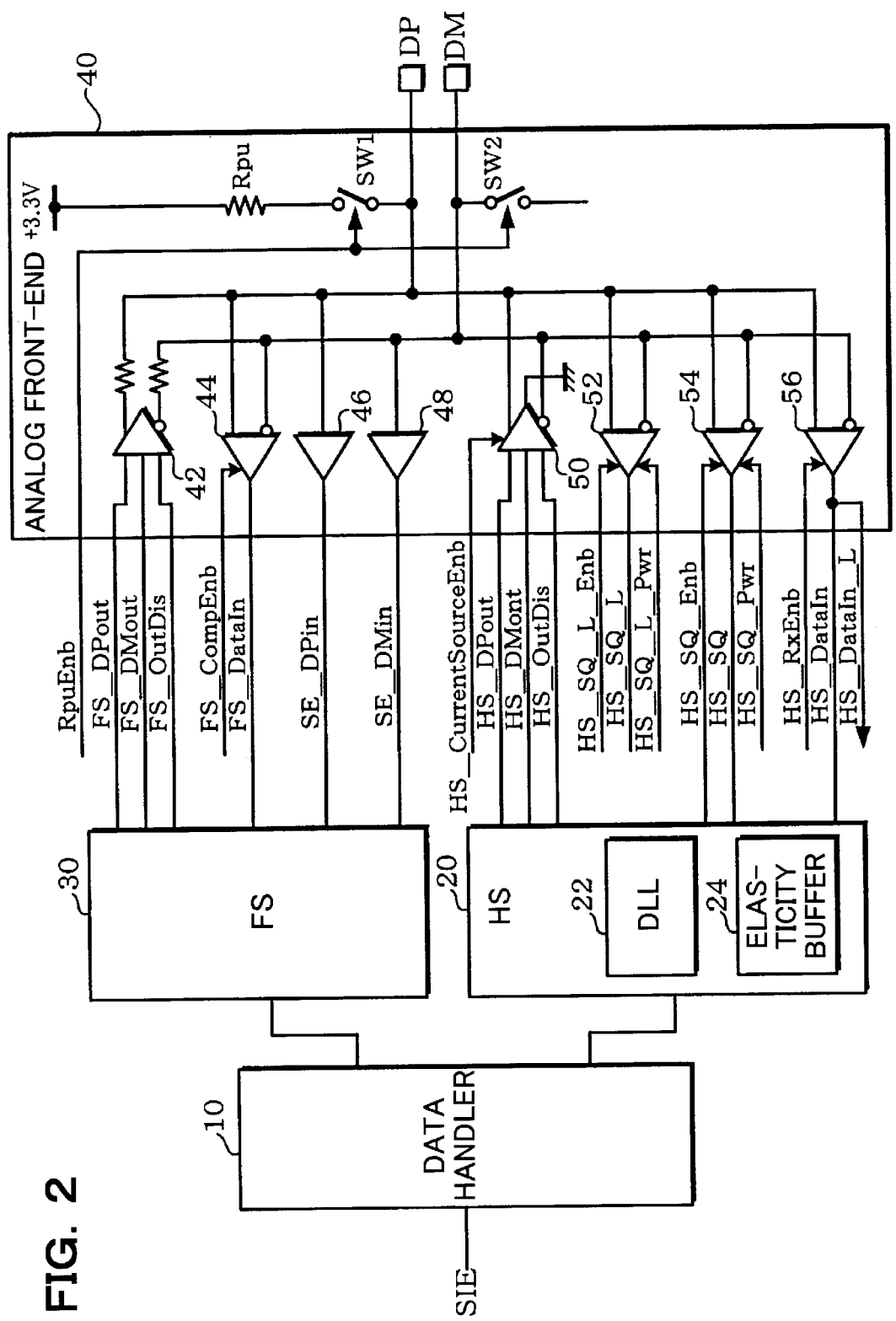
FIG. 2 is a block diagram showing an example of a configuration of a data transfer control device employing the signal detection circuit of the embodiment.

FIG. 2 shows an example of a configuration of a data transfer controller in which a signal detection circuit of the present embodiment is used.

The data transfer control device includes logic layer circuits and physical layer circuits.

The logic layer circuits include a data handler circuit 10, an High Speed (HS) circuit 20, and an Full Speed (FS) circuit 30. The physical layer circuits include an analog front-end circuit 40. It is not essential the data transfer control device includes all of the circuit blocks shown in FIG. 1, and the controller may have a configuration in which some of the blocks are omitted.

The data handler circuit (a given circuit for performing data transfer in a broad sense) 10 performs various transmission processes and reception processes for data transfer in conformity to USB 2.0. More specifically, the data handler circuit performs processes including a process of adding SYNChronization (SYNC), Start Of Packet (SOP) and End Of Packet (EOP) to transmitted data and a bit stuffing process during transmission. The data handler circuit performs processes including a process of detecting SYNC, SOP and EOP in received data and deleting the same and a bit unstuffing process during reception. Further, the data handler circuit 10 also performs a process of generating various timing signals for controlling transmission and reception of data. Such a data handler circuit 10 is connected to an SIE (Serial Interface Engine).

The SIE includes an SIE control logic for identifying an USB packet ID and address and an end-point logic for performing end-point processes such as identification of an end-point number and FIFO control.

The HS circuit 20 is a logic circuit for HS (High Speed) data transmission and reception at a data transfer speed of 480 Mbps.

The FS circuit 30 is a logic circuit for FS (Full Speed) data transmission and reception at a data transfer speed of 12 Mbps.

The analog front-end circuit 40 is an analog circuit including a driver and a receiver for FS and HS transmission and reception. According to USB, data are transmitted and received in the form of a differential pair of signals DP (data+) and DM (data−).

The data transfer control device of the present embodiment also includes a clock circuit (not shown) for generating a clock of 480 MHz used in the HS circuit 20 and a clock of 60 MHz used in the controller itself and the SIE and includes a control circuit (not shown) for generating various control signals for the analog front-end circuit 40.

The HS circuit 20 includes a DLL (delay line PLL) circuit 22 and an elasticity buffer 24.

The DLL circuit 22 generates a clock for data sampling based on a clock generated by a clock circuit that is not shown and a reception signal.

The elasticity buffer 24 is a circuit for absorbing the difference (clock drift) between a clock frequency inside the controller and a clock frequency of an external apparatus (an external apparatus connected to the bus).

In USB 2.0, an HS mode (or first mode in a broad sense) and an FS mode (or second mode in a broad sense) are defined as transfer modes. The HS mode is a transfer mode that is newly defined in USB 2.0. The FS mode is a transfer mode that has already been defined in USB 1.1.

In the HS mode, data are transmitted and received between the data handler circuit 10 and the analog front-end circuit 40 through the HS circuit 20.

In the FS mode, data are transmitted and received between the data handler circuit 10 and the analog front-end circuit 40 through the FS circuit 30.

Therefore, a driver and receiver for the HS mode for transmitting and receiving a differential pair of transmission/reception signals DP and DM in the HS mode and a driver and receiver for the FS mode for transmitting and receiving them in the FS mode are separately provided in the analog front-end circuit 40.

More specifically, the analog front-end circuit 40 includes an FS driver 42, an FS differential data receiver 44, an SE (Single-Ended)_DP receiver 46, an SE_DM receiver 48, an HS current driver 50, an HS_SQ (SQuelch)_L circuit (a signal detection circuit in a broad sense) 52 for low speed, an HS_SQ circuit (or a signal detection circuit in a broad sense) 54 for high speed, and an HS differential data receiver 56.

In the FS mode, the FS driver 42 outputs a differential pair of transmission signals FS_DPout and FS_DMout from the FS circuit 30 as a differential pair of transmission signals DP and DM. The output of the FS driver 42 is controlled by a signal FS_OutDis from the FS circuit 30.

In the FS mode, the FS differential receiver 44 amplifies the differential pair of reception signals DP and DM and outputs it to the FS circuit 30 as a signal FS_DataIn. The amplification at the FS differential receiver 44 is controlled by a signal FS_CompEnb.

In the FS mode, the SE_DP receiver 46 amplifies the signal DP that is a single-ended reception signal and outputs it to the FS circuit 30 as a signal SE_DPin.

In the FS mode, the SE_DM receiver 48 amplifies the signal DM that is a single-ended reception signal and outputs it to the FS circuit 30 as a signal SE_DMin.

In the HS mode, the HS current driver 50 a differential pair of transmission signals HS-DPout and HS-DMout from the HS circuit 30 and outputs it as a differential pair of transmission signals DP and DM. The HS current driver 50 is controlled by a signal HS_OutDis from the HS circuit 20 with respect to the operation and is controlled by a signal HS_CurrentSourceEnb with respect to the driving current.

In the FS mode, the HS_SQ_L circuit 52 for low speed detects whether there is a differential pair of reception signals DP and DM and outputs a signal HS_SQ_L as a result of the signal detection. The HS_SQ_L circuit 52 for low speed is controlled by a signal HS_SQ_L_Enb with respect to the operation and is controlled by a signal HS_SQ_L_Pwr with respect to power saving.

In the HS mode, the HS_SQ circuit 54 for high speed detects the presence of a differential pair of reception signals DP and DM and outputs a signal HS_SQ to the HS circuit 20 as a result of the signal detection. The HS_SQ circuit 54 for high speed is controlled by a signal HS_SQ_Enb from the HS circuit 20 with respect to the operation and is controlled by a signal HS_SQ_Pwr with respect to power saving.

In the HS mode, the HS differential data receiver 56 amplifies the differential pair of reception signals DP and DM and outputs signals HS_DataIn and HS_DataIn_L. The amplification at the HS differential receiver 56 is controlled by a signal HS_RxEnb.

The signal DP of the differential pair of transmission/reception signals DP and DM is (electrically) connected to a power source voltage of 3.3 V through a switch SW1 and a pull-up resistor Rpu. The signal DM of the differential pair of transmission/reception signals is connected to a switch SW2. The switches SW1 and SW2 are controlled by a signal RpuEnb. When load balance is taken into consideration, the signal DM may also be pulled up using a resistor similar to the pull-up resistor Rpu through the switch SW2. The signal RupEnb at least connects the signal DP to the pull-up resistor Rpu through the switch SW1 in the FS mode.

Thus, the data transfer control device has a configuration including drivers and receivers that are adapted to transfer speeds in the HS mode and FS mode. The signal detection circuit of the present embodiment is used for the HS_SQ_L circuit 52 for low speed and the HS_SQ circuit 54 for high speed to allow detection of the presence of the differential pair of reception signals DP and DM at a high speed having small amplitude.

In the present embodiment, the HS_SQ_L circuit 52 for low speed and the HS_SQ circuit 54 for high speed have similar configurations and have transistors in sizes optimized for the speeds of respective signals to be detected. Only the HS_SQ circuit 54 for high speed will be described below because the HS_SQ_L circuit 52 for low speed and the HS_SQ circuit 54 for high speed are similar in operations and are different only in the sizes of the transistors that form the circuits.

2.2 Signal Detection circuit

Figure 3:
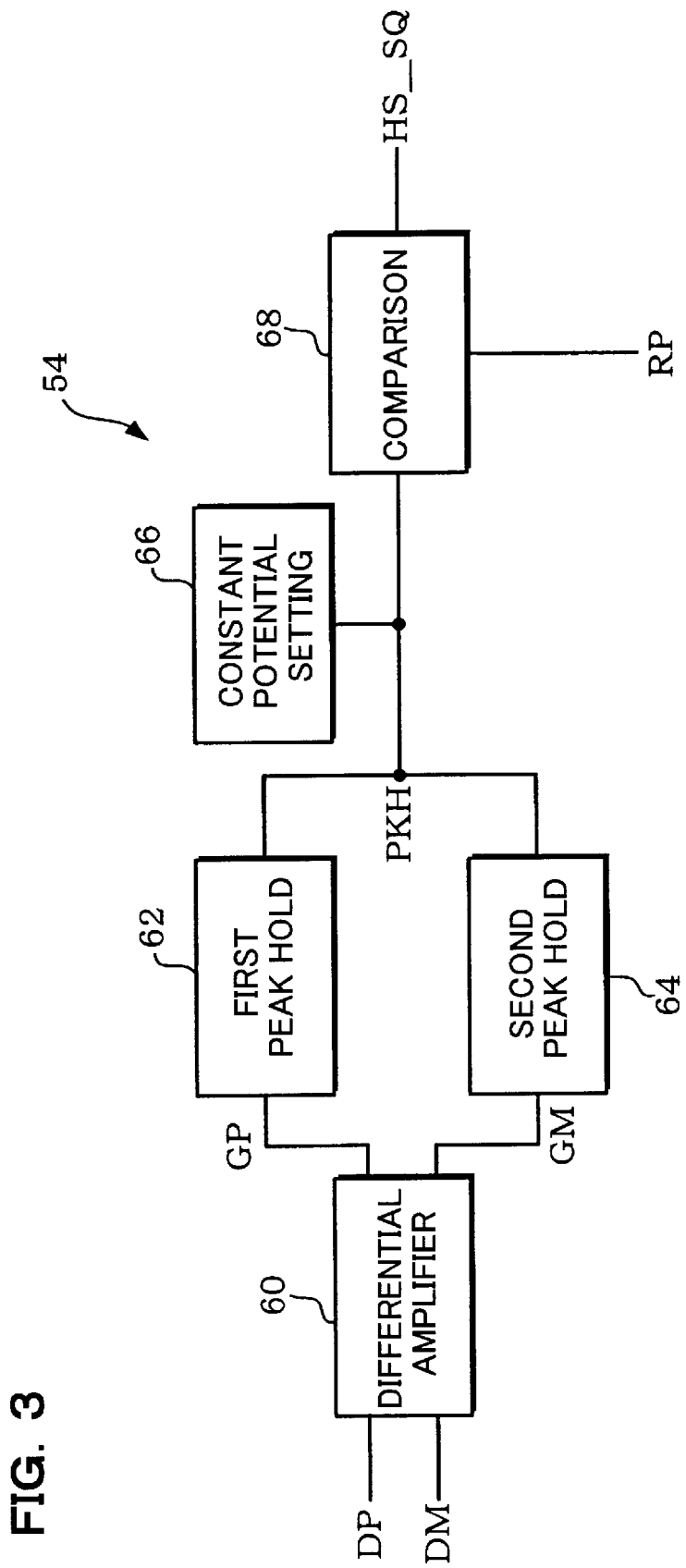
FIG. 3 is a configuration diagram showing a fundamental configuration of an HS_SQ circuit for high speed in the embodiment.

FIG. 3 shows a fundamental configuration of the HS_SQ circuit 54 for high speed.

The HS_SQ circuit 54 for high speed includes a differential amplifier 60, first and second peak hold circuits 62 and 64, a constant potential setting circuit 66, and a comparison circuit 68.

The differential amplifier circuit 60 amplifies a voltage difference between a differential pair of input signals DP and DM to generate a differential pair of output signals GP and GM.

The first peak hold circuit 62 detects a peak value of the output signal GP that is one of the differential pair of output signals and holds the peak value at a node PKH.

The second peak hold circuit 64 detects a peak value of the output signal GM that is the other of the differential pair of output signals and holds the peak value at the node PKH.

The constant potential setting circuit 66 returns the potential at the node PKH to a constant potential that is associated with a state in which no signal is detected at a time constant such that the potential changes slower than a change in the potential at the node PKH caused by the first and second peak hold circuits 62 and 64.

The comparison circuit 68 compares the potential of a reference level RP and the potential at the node PKH and outputs the result as a signal HS_SQ.

Thus, the HS_SQ circuit 54 for high speed amplifies the differential pair of output signals GP and GM based on the differential pair of input signals DP and DM and holds a peak value of each of the differential pair of output signals at the node PKH that is returned to a potential associated with a state in which no signal is detected at a certain time constant. Then, the HS_SQ circuit 54 for high speed compares the potential at the node PKH and the potential of the reference level RP. This makes it possible to accurately judge whether the differential pair of input signals DP and DM is received or not even when the signals are at a high speed and have very small amplitude.

Figure 4:
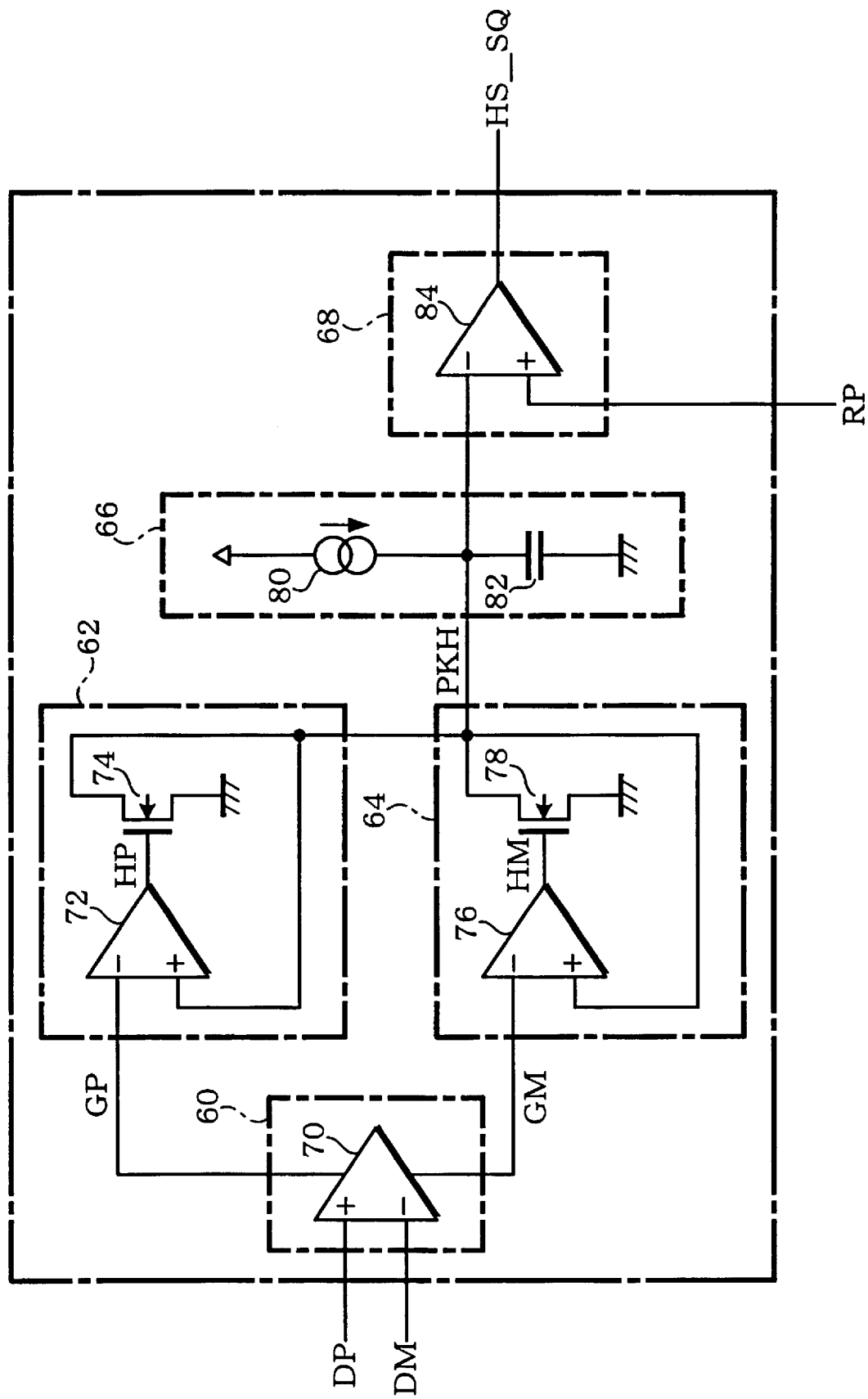
FIG. 4 is a block diagram showing a configuration of functional blocks of the HS_SQ circuit for high speed in the embodiment.

FIG. 4 shows a configuration of functional blocks of the HS_SQ circuit 54 for high speed.

The differential amplifier circuit 60 includes a differential amplifier 70. The signal DP is supplied to a non-inverting input terminal (+ terminal) of the differential amplifier 70, and the signal DM is supplied to an inverting input terminal (− terminal) of the same.

The first peak hold circuit 62 includes an operational amplifier 72 and an n-type MOS transistor 74. The signal GP is supplied to an inverting input terminal of the operational amplifier 72, and the node PKH is connected to a non-inverting input terminal of the same. An output terminal of the operational amplifier 72 is connected to a gate terminal of the n-type MOS transistor 74. A source terminal of the n-type MOS transistor 74 is connected to a ground level (or a second power source in a broad sense), and a drain terminal of the same is connected to the node PKH.

The second peak hold circuit 64 includes an operational amplifier 76 and an n-type MOS transistor 78. The signal GM is supplied to an inverting input terminal of the operational amplifier 76, and the node PKH is connected to a non-inverting input terminal of the same. An output terminal of the operational amplifier 76 is connected to a gate terminal of the n-type MOS transistor 78. A source terminal of the n-type MOS transistor 78 is connected to a ground level, and a drain terminal of the same is connected to the node PKH.

The constant potential setting circuit 66 includes a constant current source 80 and a capacitor 82.

The constant current source 80 supplies charges to the node PKH with a very small constant current from a power source (or a first power source in a broad sense).

The capacitor 82 is inserted between the ground level and the node PKH.

Since such a constant potential setting circuit 66 continues to supply very small charges to the node PKH until the potential at the node reaches a value associated with a given state in which no signal is detected, a constant potential can be restored at the node PKH at a given time constant.

The comparison circuit 68 includes an operational amplifier 84.

An inverting input terminal of the operational amplifier 84 is connected to the node PKH, and the reference level RP is supplied to a non-inverting input terminal of the same. As a result, a signal in accordance with a difference between the potential at the node PKH and the potential of the reference level RP is output from an output terminal of the operational amplifier 84. This output signal serves as a signal detection signal HS_SQ indicating whether there is a differential pair of input signals.

2.2.1 Example of Configuration

Figure 5:
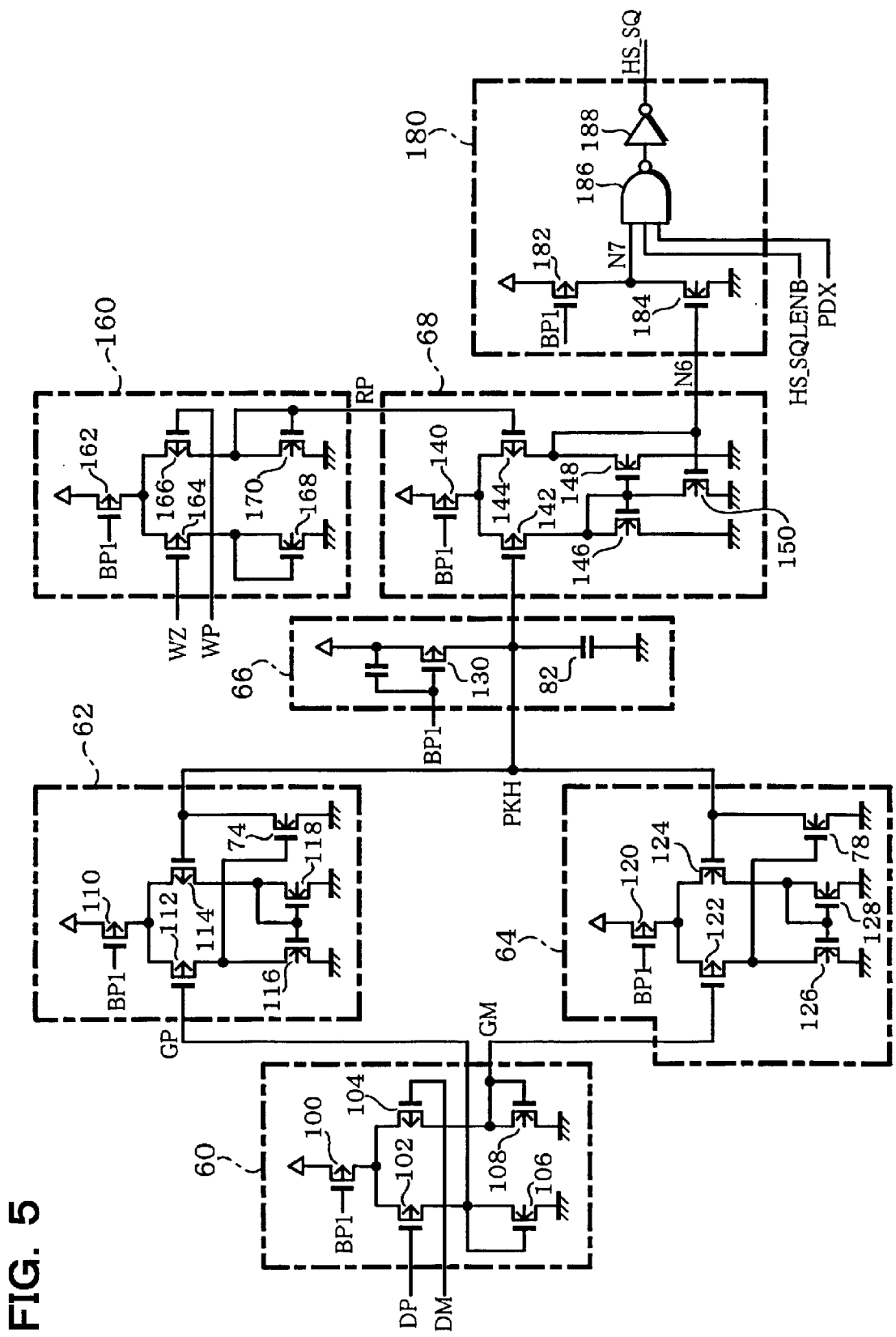
FIG. 5 is a circuit configuration diagram showing an example of a circuit configuration of the HS_SQ circuit for high speed in the embodiment at a transistor level.

FIG. 5 shows an example of a circuit configuration of the HS_SQ circuit 54 for high speed shown in FIG. 4 on the transistor level.

Parts identical to those appearing in the HS_SQ circuit 54 for high speed shown in FIG. 4 are indicated by like reference numerals, and the description will appropriately omit such parts.

An output circuit is provided to perform logical level conversion in order to supply a signal detection signal HS_SQ to a logic circuit connected downstream thereof and to perform masking such that changes in the signal detection signal HS_SQ in an unstable period will not be propagated downstream.

Differential Amplifier Circuit

The differential amplifier circuit 60 includes p-type MOS transistors (or transistors of a first conductivity type in a broad sense) 100, 102, and 104 and n-type MOS transistors (or transistors of a second conductivity type in a broad sense) 106 and 108.

A power source level (a first power source) is connected to a source terminal of the p-type MOS transistor 100 (a first transistor of the first conductivity type), and an operation control signal BP1 is supplied to a gate terminal of the same.

A drain terminal of the p-type MOS transistor 100 is connected to a source terminal of the p-type MOS transistor 102 (a second transistor of the first conductivity type), and the signal DP is supplied to a gate terminal of the same.

The drain terminal of the p-type MOS transistor 100 is connected to a source terminal of the p-type MOS transistor 104 (a third transistor of the first conductivity type), and the signal DM is supplied to a gate terminal of the same.

The ground level (the second power source) is connected to a source terminal of the n-type MOS transistor 106 (a first transistor of the second conductivity type), and a drain terminal of the p-type MOS transistor 102 is connected to a gate terminal and a drain terminal of the same.

The ground level (the second power source) is connected to a source terminal of the n-type MOS transistor 108 (a second transistor of the second conductivity type), and a drain terminal of the p-type MOS transistor 104 is connected to a gate terminal and a drain terminal of the same.

The signal GP is taken out from the gate terminal and drain terminal of the n-type MOS transistor 106.

The signal GM is taken out from the gate terminal and drain terminal of the n-type MOS transistor 108.

In the differential amplifier circuit 60 having such a configuration, if the potential of the signal DM is lower than the potential of the signal DP when the operation control signal BP1 causes a drain current to flow through the p-type MOS transistor 100, the potential of the signal GM increases beyond the potential of the signal GP such that a drain current of the p-type MOS transistor 104 becomes greater than a drain current of the p-type MOS transistor 102.

On the contrary, if the potential of the signal DM is higher than the potential of the signal DP, the potential of the signal GP increases beyond the potential of the signal GM such that the drain current of the p-type MOS transistor 102 becomes greater than the drain current of the p-type MOS transistor 104.

In the differential amplifier circuit 60, a potential level V0 at which the differential pair of input signals DP and DM are equal is determined by the characteristics of the p-type MOS transistor 102, n-type MOS transistor 106, p-type MOS transistor 104, and n-type MOS transistor 108. As described above, as a result of the generation of a potential difference between the differential pair of input signals DP and DM, in the differential amplifier circuit 60, the potential levels of the signals GP and GM change in accordance with the potential difference between the differential pair of input signals DP and DM, the potential level V0 serving as a reference.

First Peak Hold Circuit

The first and second peak hold circuits 62 and 64 have similar configurations and have transistors of similar sizes.

The first peak hold circuit 62 includes p-type MOS transistors 110, 112, and 114 and n-type MOS transistors 74, 116, and 118.

The power source level (the first power source) is connected to a source terminal of the p-type MOS transistor 110 (a fourth transistor of the first conductivity type), and the operation control signal BP1 is supplied to a gate terminal of the same.

A drain terminal of the p-type MOS transistor 110 is connected to a source terminal of the p-type MOS transistor 112 (a fifth transistor of the first conductivity type), and the signal GP is supplied to a gate terminal of the same.

The drain terminal of the p-type MOS transistor 110 is connected to a source terminal of the p-type MOS transistor 114 (a sixth transistor of the first conductivity type).

The ground level (the second power source) is connected to a source terminal of the n-type MOS transistor 116 (a third transistor of the second conductivity type), and a drain terminal of the p-type MOS transistor 112 is connected to a drain terminal of the same.

The ground level (the second power source) is connected to a source terminal of the n-type MOS transistor 118 (a fourth transistor of the second conductivity type), and a drain terminal of the p-type MOS transistor 114 is connected to a drain terminal of the same.

Gate terminals of the n-type MOS transistors 116 and 118 are connected to each other and are also connected to the drain terminal of the n-type MOS transistor 118.

The ground level (the second power source) is connected to a source terminal of the n-type MOS transistor 74 (a fifth transistor of the second conductivity type); the drain terminal of the n-type MOS transistor 116 is connected to a gate terminal of the same; and a gate terminal of the p-type MOS transistor 114 is connected to a drain terminal of the same.

The gate terminal of the p-type MOS transistor 114 is also connected to the node PKH.

The first peak hold circuit 62 having such a configuration starts a holding operation when the operation control signal BP1 causes a drain current to flow through the p-type MOS transistor 110.

When the potential at the node PKH is higher than the potential of the signal GP, a greater drain current flows through the p-type MOS transistor 112 to increase the potential at the drain terminal of the n-type MOS transistor 116. This increases a current flowing from the node PKH to the ground level through the n-type MOS transistor 74. This results in a decrease in the potential at the node PKH.

That is, the first peak hold circuit 62 operates to hold a lower limit value of the potential of the signal GP at the node PKH.

When the potential at the node PKH is lower than the potential of the signal GP, a greater amount of the drain current of the p-type MOS transistor 114 flows to increase a potential at the drain terminal of the n-type MOS transistor 118. This results in a flow of a drain current of the n-type MOS transistor 116 that forms a current mirror structure in combination with the n-type MOS transistor 118, and the potential at the drain terminal of the n-type MOS transistor 116 is thus determined. At this time, the n-type MOS transistor 74 is off, or it allows only a small amount of drain current to flow. Therefore, the potential at the node PKH is gradually increased by supplying a very small charge to the node PKH at a time from the constant potential setting circuit 66.

Second Peak Hold Circuit

The second peak hold circuit 64 includes p-type MOS transistors 120, 122, and 124 and n-type MOS transistors 78, 126, and 128.

The power source level (the first power source) is connected to a source terminal of the P-type MOS transistor 120 (a fourth transistor of the first conductive type), and the operation control signal BP1 is supplied to a gate terminal of the same.

A drain terminal of the p-type MOS transistor 120 is connected to a source terminal of the p-type MOS transistor 122, (a fifth transistor of the first conductivity type), and the signal GM is supplied to a gate terminal of the same.

The drain terminal of the p-type MOS transistor 120 is connected to a source terminal of the p-type MOS transistor 124 (a sixth transistor of the first conductivity type).

The ground level (the second power source) is connected to a source terminal of the n-type MOS transistor 126 (a third transistor of the second conductivity type), and a drain terminal of the p-type MOS transistor 122 is connected to a drain terminal of the same.

The ground level (the second power source) is connected to a source terminal of the n-type MOS transistor 128 (a fourth transistor of the second conductivity type), and a drain terminal of the p-type MOS transistor 124 is connected to a drain terminal of the same.

Gate terminals of the n-type MOS transistors 126 and 128 are connected to each other and are also connected to the drain terminal of the n-type MOS transistor 128.

The ground level (the second power source) is connected to a source terminal of the n-type MOS transistor 78 (a fifth transistor of the second conductivity type); the drain terminal of the n-type MOS transistor 126 is connected to a gate terminal of the same; and a gate terminal of the p-type MOS transistor 124 is connected to a drain terminal of the same.

The gate terminal of the p-type MOS transistor 124 is also connected to the node PKH.

The operation of the second peak hold circuit 64 will not be described because it is similar to the operation of the first peak hold circuit 62 having a similar configuration.

Thus, the first and second peak hold circuits 62 and 64 respectively hold lower limit values of the potentials of the signals GP and GM at the node PKH. Very small charges are supplied to the node PKH from the constant potential setting circuit 66.

Constant Potential Setting Circuit

The constant potential setting circuit 66 includes a p-type MOS transistor 130 and a capacitor 82.

The power source (the first power source) is connected to the bulk and a source terminal of the p-type MOS transistor 130 (a thirteenth transistor of the first conductivity type), and the ground level (second power source) is connected to a drain terminal of the same through the capacitor.

The operation control signal BP1 is supplied to a gate terminal of the p-type MOS transistor 130, and the node PKH is connected to the drain terminal of the same.

In such a constant potential setting circuit 66, the operation control signal BP1 causes the p-type MOS transistor 130 to operate as a constant current source that supplies very small charges to the node PKH until the node PKH reaches a potential associated with a given state of no detection. The charges are held at the node PKH by the capacitor 82 inserted between the node and the ground level (second power source) The node PKH is discharged as occasions demand by the n-type MOS transistors 74 and 78 of the first and second peak hold circuits 62 and 64 as described above in accordance with a difference of the potential thereof from the signal GP or GM.

Comparison Circuit

The comparison circuit 68 includes p-type MOS transistors 140, 142, and 144 and n-type MOS transistors 146, 148, and 150.

The power source level (the first power source) is connected to a source terminal of the p-type MOS transistor 140 (a seventh transistor of the first conductivity type), and the operation control signal BP1 is supplied to a gate terminal of the same.

A drain terminal of the p-type MOS transistor 140 is connected to a source terminal of the p-type MOS transistor 142 (an eighth transistor of the first conductivity type), and the node PKH is connected to a gate terminal of the same.

A drain terminal of the p-type MOS transistor 140 is connected to a source terminal of the p-type MOS transistor 144 (a ninth transistor of the first conductivity type), and the reference level RP is supplied to a gate terminal of the same.

The ground level (the second power source) is connected to a source terminal of the n-type MOS transistor 146 (a sixth transistor of the second conductivity type), and a drain terminal of the p-type MOS transistor 142 is connected to a drain terminal of the same.

The ground level (the second power source) is connected to a source terminal of the n-type MOS transistor 148 (a seventh transistor of the second conductivity type), and a drain terminal of the p-type MOS transistor 144 is connected to a drain terminal of the same.

Gate terminals of the n-type MOS transistors 146 and 148 are connected to each other and are also connected to the drain terminal of the n-type MOS transistor 146.

The ground level (the second power source) is connected to a source terminal of the n-type MOS transistor 150 (an eighth transistor of the second conductivity type), and the gate terminals of the n-type MOS transistors 146 and 148 are connected to a drain terminal of the same. A gate terminal of the n-type MOS transistor 150 is connected to the drain terminal of the n-type MOS transistor 148.

In such a comparison circuit 68, a comparison signal N6 is taken out at the drain terminal of the n-type MOS transistor 148.

The comparison circuit 68 starts a comparing operation when the operation control signal BP1 causes a drain current of the p-type MOS transistor 130 to flow.

For example, when the potential at the node PKH is higher than the potential of the reference level RP, a greater amount of the drain current flows to the p-type MOS transistor 144 to increase the potential at the drain terminal of the n-type MOS transistor 148. Therefore, the potential of the comparison signal N6 is increased.

On the contrary, when the potential at the node PKH is lower than the potential of the reference level RP, the drain current of the p-type MOS transistor 144 decreases to decrease the potential at the drain terminal of the n-type MOS transistor 148. Therefore, the potential of the comparison signal N6 drops.

The comparison circuit 68 of the present embodiment has hysteresis characteristics because the n-type MOS transistor 150 is provided. Specifically, when the potential of the comparison signal N6 increases, a current flows also through the n-type MOS transistor 150 to accelerate the potential drop at the drain terminal of the n-type MOS transistor 146. Since the comparison signal N6 can have different thresholds for a change when the potential at the node PKH increases beyond the potential of the reference level RP and when the potential at the node PKH decreases blow the potential of the reference level RP, the reliability of signal detection can be improved.

Reference Level Generation Circuit

The level of the constant potential at the node PKH associated with the state of no detection is determined by the characteristics of the p-type MOS transistors that are turned on by the operation control signal BP1. However, the characteristics of p-type MOS transistors vary depending on the environment of operation such as temperature. Therefore, when the potential at the node PKH is compared with a constant reference level RP, the accuracy of signal detection is significantly reduced depending on the environment of operation.

In the present embodiment, a reference level generation circuit 160 for generating the reference level RP is provided in order to change the reference level RP in accordance with changes in the constant potential level. The reference level generation circuit 160 is configured using transistors of the same size and configuration as those of the differential amplifier circuit 60 such that it will be similar to the differential amplifier circuit 60 in electrical characteristics including temperature characteristics.

Therefore, even when there is a change in the constant potential level attributable to a temperature change, a corresponding change can be caused in the level of the reference level according to the similar temperature characteristics. This makes it possible to perform the comparison with the reference level accurately.

The reference level generation circuit 160 includes p-type MOS transistors 162, 164, and 166 and n-type MOS transistors 168 and 170.

The power source level (first power source) is connected to a source terminal of the p-type MOS transistor 162 (a tenth transistor of the first conductivity type), and the operation control signal PB1 is supplied to a gate terminal of the same.

A drain terminal of the p-type MOS transistor 162 is connected to a source terminal of the p-type MOS transistor 164 (an eleventh transistor of the first conductivity type), and a signal WZ that is one of a differential pair of detection level input signals WP and WZ is supplied to a gate terminal of the same.

The drain terminal of the p-type MOS transistor 162 is connected to a source terminal of the p-type MOS transistor 166 (a twelfth transistor of the first conductivity type), and the signal WP that is one of the differential pair of detection level input signals WP and WZ is supplied to a gate terminal of the same.

The ground level (the second power source) is connected to a source terminal of the n-type MOS transistor 168 (a ninth transistor of the second conductivity type), and a drain terminal of the p-type MOS transistor 164 is connected to a gate terminal and a drain terminal of the same.

The ground level (the second power source) is connected to a source terminal of the n-type MOS transistor 170 (a tenth transistor of the second conductivity type), and a drain terminal of the p-type MOS transistor 166 is connected to a gate terminal and a drain terminal of the same.

The reference level RP is taken out at the gate terminal and drain terminal of the n-type MOS transistor 170.

Such a reference level generation circuit 160 generates the reference level RP by amplifying a potential difference between the differential pair of detection level input signals WP and WZ. Since the reference level generation circuit 160 has electrical characteristics similar to those of the differential amplifier circuit 60, the reference level RP is generated in accordance with changes in the potentials of the differential pair of output signals GP and GM depending on environmental changes such as temperature changes.

Output Circuit

The present embodiment has an output circuit 180 for converting the comparison signal N6 into a logical level, the comparison signal N6 being a result of accurate comparison with such a reference level RP performed by the comparison circuit 68.

When a signal detection enable signal HS_SQLENB (or the signal HS_SQ_Enb shown in FIG. 1) and an enable signal PDX are at the logical level "H", the output circuit 180 converts the comparison signal N6 into a logical level and outputs the same as a comparison result signal HS_SQ.

The signal detection enable signal HS_SQLENB is an enable signal for the HS_SQ circuit 54 for high speed, and the enable signal PDX is at the logical level "H" at least during a receiving operation. By providing the signal detection enable signal HS_SQLENB and the enable signal PDX separately, it is possible to prevent a comparison result signal HS_SQ in accordance with an unstable comparison signal N6 from being output in an unstable period before the operation of the HS_SQ circuit 54 for high speed becomes stable after the beginning of the receiving operation.

Such an output circuit 180 includes a p-type MOS transistor 182, an n-type MOS transistor 184, a NAND circuit 186 with three inputs and one output, and an inverter circuit 188. Since the NAND circuit 186 with three inputs and one output and the inverter 188 have well-known configurations, no transistor level illustration is presented.

The power source level (the first power source) is connected to a source terminal of the p-type MOS transistor 182 (a fourteenth transistor of the first conductivity type), and the operation control signal BP1 is supplied to a gate terminal of the same.

The ground level (the second power source) is connected to a source terminal of the n-type MOS transistor 184 (an eleventh transistor of the second conductivity type), and the comparison signal N6 is supplied to a gate terminal of the same.

A drain terminal of the p-type MOS transistor 182 and a drain terminal of the n-type MOS transistor 184 are connected to each other and are connected to one of input terminals of the NAND circuit 186 with three inputs and one output as a comparison signal N7.

The signal detection enable signal HS_SQLENB and the enable signal PDX are supplied to another input terminal of the NAND circuit 186 with three inputs and one output.

An output terminal of the NAND circuit 186 with three inputs and one output is connected to an input terminal of the inverter circuit 188.

The comparison result signal HS_SQ is output from an output terminal of the inverter circuit 188.

In the output circuit 180 having such a configuration, when the operation control signal BP1 causes a drain current to flow through the p-type MOS transistor 182, the n-type MOS transistor 184 is controlled by the potential of the comparison signal N6. When the n-type MOS transistor 184 is turned on, the drain terminal of the n-type MOS transistor 184 reaches the ground level, and the comparison signal N7 turns to the logical level "L". Therefore, when the signal detection enable signal HS_SQLENB and the enable signal PDX are at the logical level "H", the comparison result signal HS_SQ is at the logical level "L".

When the n-type MOS transistor 184 is off, since the drain terminal of the n-type MOS transistor 184 stays at the power source level, the comparison signal N7 is at the logical level "H". Therefore, when the signal detection enable signal HS_SQLENB and the enable signal PDX are at the logical level "H", the comparison result signal HS_SQ is at the logical level "H.

Operation Control Signal Generation Circuit

The operations of the units forming the HS_SQ circuit 54 for high speed of the present embodiment are all controlled by the operation control signal BP1. The operation control signal BP1 is generated by an operation enable signal XIQ (or the signal HS_SQ_Pwr shown in FIG. 2) from the HS_SQ circuit 54 for high speed.

Figure 6:
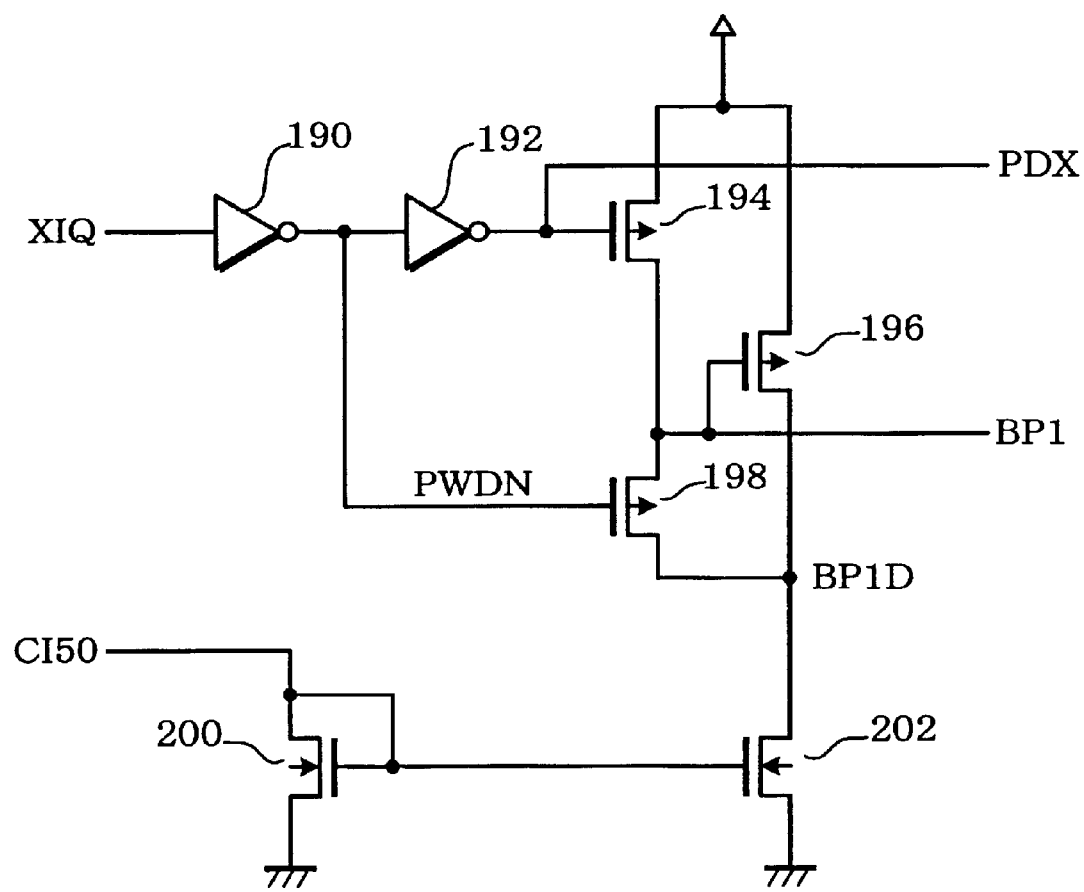
FIG. 6 is a configuration diagram showing an example of a configuration of an operation control signal generation circuit for generating an operation control signal.

FIG. 6 shows an example of a configuration of an operation control signal generation circuit for generating the operation control signal BP1 from such an operation enable signal XIQ.

The operation control signal generation circuit includes inverter circuits 190 and 192, p-type MOS transistors 194, 196, and 198 and n-type MOS transistors 200 and 202.

The operation enable signal XIQ is supplied to an input terminal of the inverter circuit 190, and an inverted enable signal PWDN is output from an output terminal of the same. The inverted enable signal PWDN is supplied to an input terminal of the inverter 192 and a gate terminal of the p-type MOS transistor 198.

The enable signal PDX is output from an output terminal of the inverter circuit 192.

The enable signal PDX is supplied to a gate terminal of the p-type MOS transistor 194.

The power source level (the first power source) is connected to a source terminal of the p-type MOS transistor 194. The operation control signal BP1 is taken out at a drain terminal of the p-type MOS transistor 194.

The power source level (the first power source) is connected to a source terminal of the p-type MOS transistor 196. A node BP1D is connected to a drain terminal of the p-type MOS transistor 196, and the operation control signal BP1 is supplied to a gate terminal of the same.

The drain terminal of the p-type MOS transistor 194 is connected to a source terminal of the p-type MOS transistor 198, and the node BP1D is connected to a drain terminal of the same.

An operation reference current CI50 is supplied to a drain terminal and a gate terminal of the n-type MOS transistor 200 from the outside. A source terminal of the n-type MOS transistor 200 is connected to the ground level (the second power source).

The ground level (the second power source) is connected to a source terminal of the n-type MOS transistor 202; the gate terminal of the n-type MOS transistor 200 is connected to a gate terminal of the same; and the node BP1D is connected to a drain terminal of the same.

In the operation control signal generation circuit having such a configuration, the n-type MOS transistors 200 and 202 are in a current mirror configuration, and a current that is the value of the current CI50 multiplied by the mirror ratio serves as a drain current of the n-type MOS transistor 202.

When the operation enable signal XIQ is at the logical level "L", since the p-type MOS transistor 194 is on and the p-type MOS transistor 198 is off, the operation control signal BP1 is at the power source level. Therefore, no operation is performed by each unit of the HS_SQ circuit 54 for high speed to which the operation control signal BP1 is supplied at the gate terminal of a p-type MOS transistor.

When the operation enable signal XIQ is at the logical level "H", since the p-type MOS transistor 194 is off and the p-type MOS transistor 198 is on, the operation control signal BP1 is at a potential in accordance with the drain current of the n-type MOS transistor 202. This causes the operation of each unit of the HS_SQ circuit 54 for high speed to which the operation control signal BP1 is supplied at the gate terminal of a p-type MOS transistor.

2.2.2 Example of Operation

An example of the operation of the HS_SQ circuit 54 for high speed having the above-described configuration will now be described with reference to FIG. 7A, FIG. 7B, and FIG. 8.

The HS_SQ circuit 54 for high speed of the present embodiment detects whether there is a differential pair of reception signals, i.e., a signal DP having an amplitude of 400 mV relative to the ground level during transfer of data "H" according to USB 2.0 and a signal DM having an amplitude of 400 mV relative to the ground level during transfer of data "L".

Figure 7A:
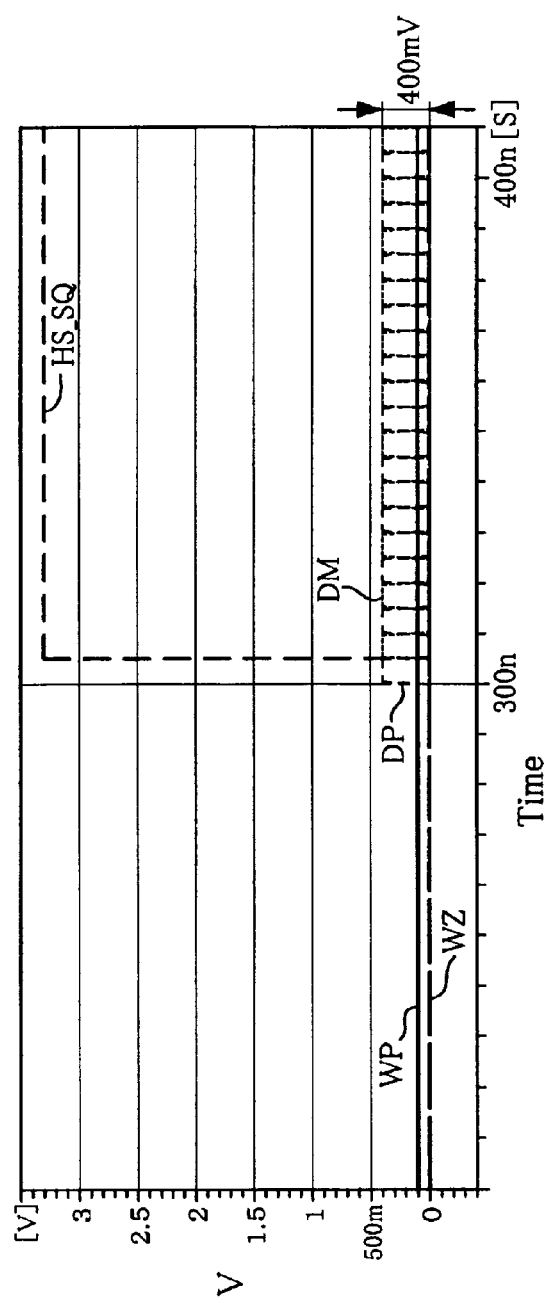
FIG. 7A is a waveform diagram showing examples of waveforms of various signals input and output to and from the HS_SQ circuit for high speed in the embodiment.

FIG. 7A shows examples of various signals input and output to and from the HS_SQ circuit 54 for high speed.

As described above, the HS_SQ circuit 54 for high speed is enabled for signal detection based on the reference level RP by supplying the differential pair of detection level input signals WP and WZ to the reference level generation circuit 160 in advance. The signal WZ is connected to the ground level, and a given detection level voltage is supplied as the signal WP.

In this case, let us assume that the differential pair of input signals DP and DM alternately has amplitude of 400 mV to provide reception data "H, L, H, L, . . . ". Then, a signal HS_SQ can be output with a delay of about 4 nanoseconds [ns] using a power source of 3.3 V by optimizing the size of each transistor, although the result depends on the process employed.

Figure 7B:
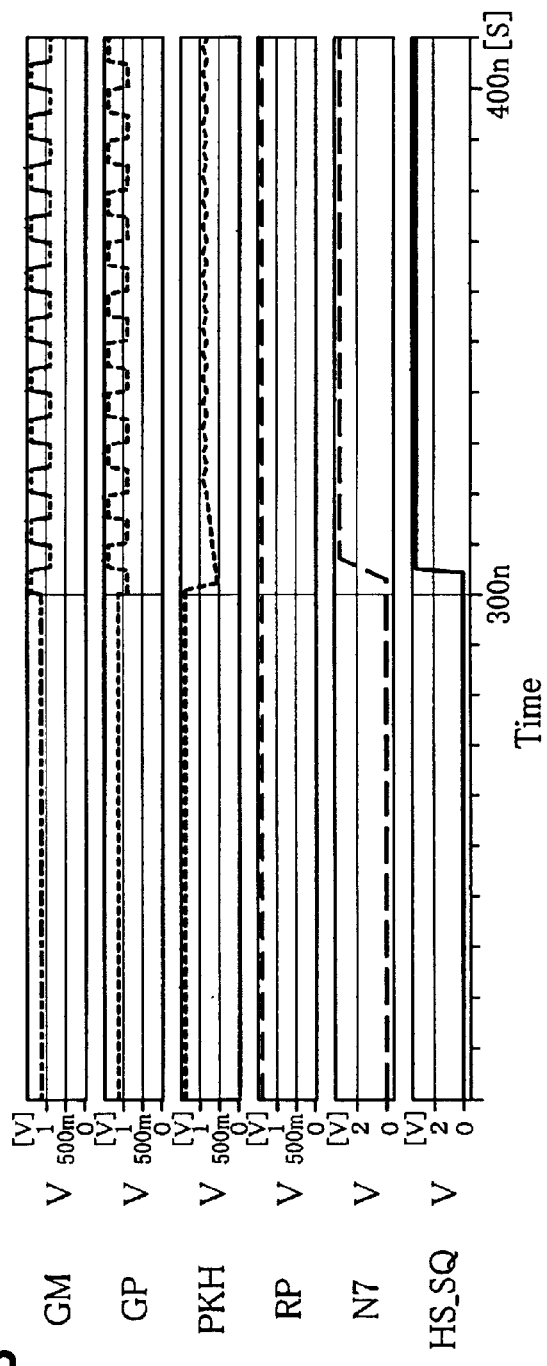
FIG. 7B is a waveform diagram showing an example of an operating waveform of each node in the HS_SQ circuit for high speed in the embodiment.

FIG. 7B shows an example of an operating waveform of each node in the HS_SQ circuit 54 for high speed.

The differential pair of output signals GP and GM from the differential amplifier circuit 60, the node PKH, the reference level RP, and the comparison signal N7 are shown along with the comparison result signal HS_SQ.

The operation of the HS_SQ circuit 54 for high speed of the present embodiment is started by supplying a predetermined constant current value (50 µA, for example) as the operation reference current CI50 from an external constant current source to put the operation enable signal XIQ at the logical level "H".

For example, when the differential pair of input signals DP and DM is input at the timing shown in FIG. 7A, the differential amplifier circuit 60 amplifies a voltage that is the difference between the signals DP and DM (400 mV in this case) as described above to generate the differential pair of output signals GP and GM. The differential pair of output signals GP and GM fluctuates in positive and negative directions relative to a potential (1.2 V, for example) that is determined in accordance with the characteristics of the p-type MOS transistor 100 controlled by the operation control signal BP1 in the differential amplifier circuit 60.

The first peak hold circuit 62 holds a lower limit value of the potential of the signal GP (relative to the ground level). Specifically, in the first peak hold circuit 62, when the potential at the node PKH is higher than the potential of the signal GP, since a greater amount of current flows through p-type MOS transistor 112 to increase the potential at the drain terminal of the n-type MOS transistor 116, the amount of the current that flows from the node PKH through the n-type MOS transistor 74 increases to make the potentials of the node PKH and the signal GP equal to each other consequently as shown in FIG. 8.

The second peak hold circuit 64 holds a lower limit value of the potential of the signal GM (relative to the ground level). Specifically, it makes the potential at the node PKH equal to the potential of the signal GM similarly to the first peak hold circuit 62.

In practice, very small charges are steadily supplied to the node PKH by the constant potential setting circuit 66 to return the potential at the node to a constant potential gradually, and the comparison circuit 68 compares the potential with the reference level RP generated by the reference level generation circuit 160.

As described above, the comparison circuit 68 provides a comparison signal N6 having a low potential when the potential at the node PKH is lower than the potential of the reference level RP and a comparison signal N6 having a higher potential when the potential at the node PKH is higher than the potential of the reference level RP.

Figure 8:
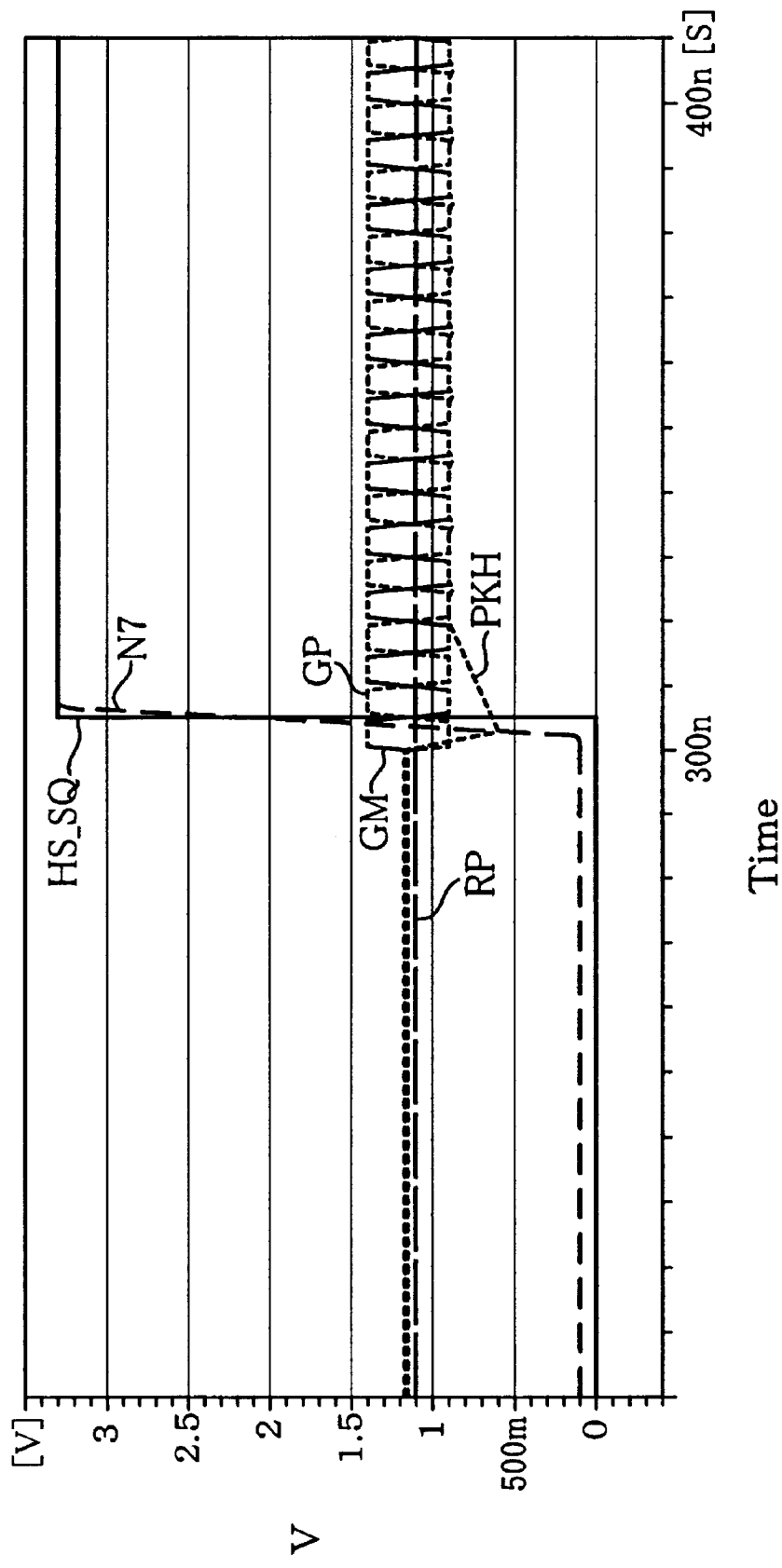
FIG. 8 is a waveform diagram showing a relationship between timing of signals in the HS_SQ circuit for high speed in the embodiment.

Therefore, since the comparison signal N7 reaches the power source level when the potential of the comparison signal N6 decreases to turn off the n-type MOS transistor 184 of the output circuit 180, the comparison result signal HS_SQ is at the logical level "H" as shown in FIG. 8 when the signal detection enable signal HS_SQLENB and the enable signal PDX are at the logical level "H".

As shown in FIG. 8, since the comparison signal N7 reaches the ground level when the potential of the comparison signal N6 increases to turn on the n-type MOS transistor 184 of the output circuit 180, the comparison result signal HS_SQ is at the logical level "L" as shown in FIG. 8 when the signal detection enable signal HS_SQLENB and the enable signal PDX are at the logical level "H".

Thus, according to the present embodiment, a peak value of an input signal is held at a node that is returned to a constant potential, and the potential of the node that has been subjected to a resultant change is compared with a given reference level. This makes it possible to detect a reception signal at a high speed having very small amplitude in conformity to USB 2.0 standard accurately without using costly fine processing. In particular, since a configuration is employed in which charges are supplied to the node and properly removed in accordance with the peak value to be held as in the present embodiment, an input signal at a high speed can be accommodated with an improved response.

The operation of such an HS_SQ circuit 54 for high speed can be controlled by generating the operation control signal BP1 from the operation enable signal XIQ and the signal detection enable signal HS_SQLENB as shown in FIG. 6, which makes it possible to prevent an unstable comparison result signal HS_SQ from being output to the outside.

FIG. 9 shows a truth table representing the operation of such an HS_SQ circuit 54 for high speed.

"H" represents the logical level "H"; "L" represents the logical level "L"; and "X" represents DON'T CARE.

The comparison result signal HS_SQ is output as a proper result of signal detection only when the operation enable signal XIQ and the signal detection enable signal HS_SQLENB are at the logical level "H", and the comparison result signal HS_SQ is otherwise fixedly output at the logical level "L" to prevent any comparison result signal HS_SQ output in an unstable period from being propagated to downstream circuits that use the comparison result signal HS_SQ.

When the operation enable signal XIQ and the signal detection enable signal HS_SQLENB are at the logical level "H", the HS_SQ circuit 54 for high speed outputs the result of comparison between the difference between the differential pair of detection level input signals WP and WZ supplied to the reference level generation circuit 160 and the difference between the differential pair of input signals DP and DM as the comparison result signal HS_SQ. As described above, in the HS_SQ circuit 54 for high speed, signal detection is actually performed by comparing the reference level RP that is an amplified voltage associated with the difference between the differential pair of detection level input signals WP and WZ and the node PKH at an amplified voltage associated with the difference between the differential pair of input signals DP and DM.

Since the reference level signal RP is thus generated by the reference level generation circuit 160 that has electrical characteristics similar to those of the differential amplifier circuit 60, a detection level can be set without taking the potential of the reference level RP into consideration during circuit designing.

Figure 10:
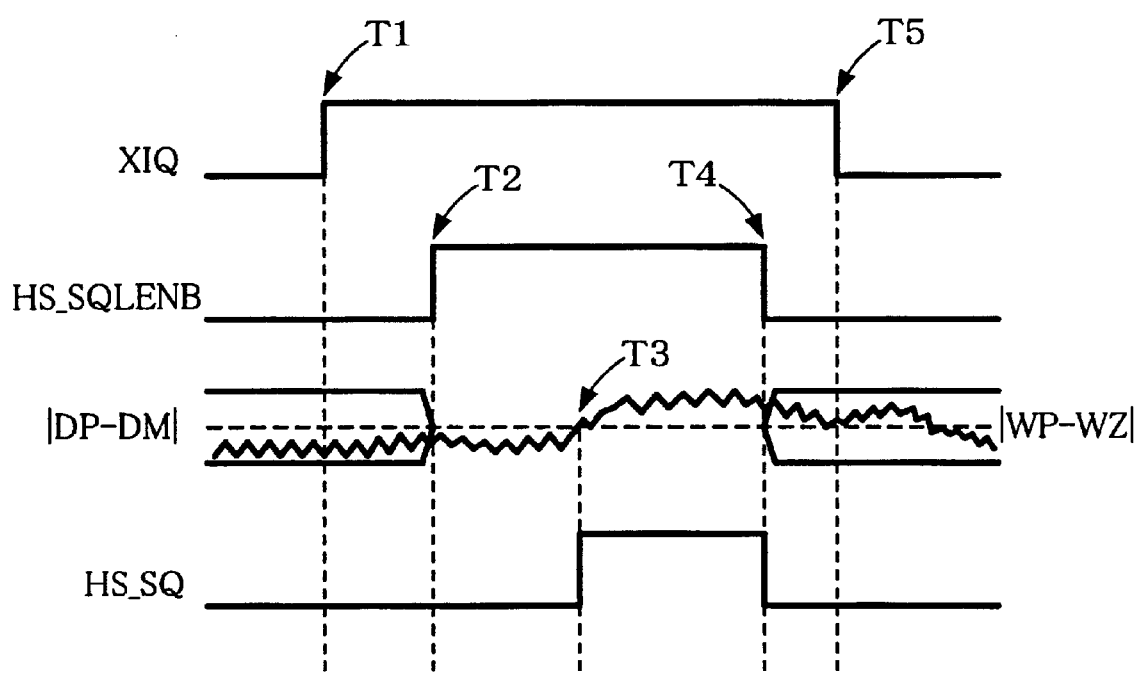
FIG. 10 is a waveform diagram showing an example of timing for controlling the operation of the HS SQ circuit for high speed in the embodiment.

FIG. 10 shows an example of timing for controlling the operation of the HS_SQ circuit 54 for high speed.

For example, the differential pair of input signals DP and DM can be detected by putting the operation enable signal XIQ at the logical level "H" at a point in time T1 and by thereafter putting the signal detection enable signal HS_SQLENB at the logical level "H" at a point in time T2. Therefore, the comparison result signal HS_SQ is output at the logical level "L" from the point in time T2 until a point in time T3 at which the difference between the differential pair of input signals DP and DM exceeds the difference between the differential pair of detection level input signals WP and WZ, and the comparison result signal HS_SQ is output at the logical level "H" on and after the point in time T3.

It is possible to fix the output of the comparison result signal HS_SQ at the logical level "L" at a point in time T4 by putting the signal detection enable signal HS_SQLENB at the logical level "L" and to stop the operation of the HS_SQ circuit 54 for high speed as a whole caused by the operation control signal BP1 at a point in time T5 by putting the operation enable signal XIQ at the logical level "L".

The operation of the HS_SQ circuit 54 for high speed has been described, and the description equally applies to the operation of the HS_SQ_L circuit 52 for low speed. In the HS_SQ_L circuit 52 for low speed, transistor sizes can be optimized with importance attached to signal detection sensitivity unlike the transistors in the HS_SQ circuit 54 for high speed whose sizes are optimized with importance attached to the speed of response.

3. Electronic Equipment

Examples of electronic equipment including the data transfer controller of the invention as described above will now be described.

Figure 11A:
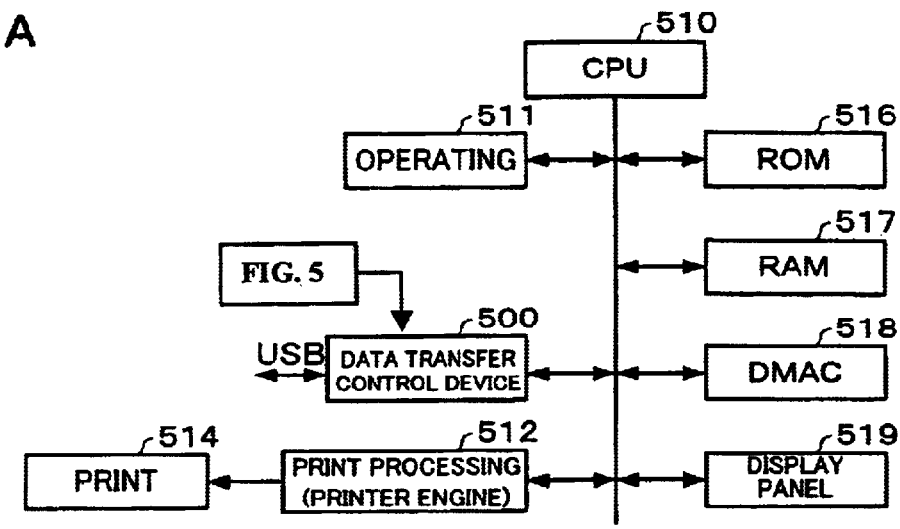
FIGS. 11A, 11B, and 11C show examples of internal blocks of various electronic equipment.
Figure 12A:
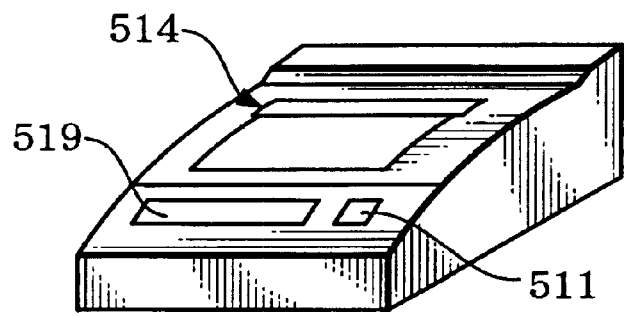
FIGS. 12A, 12B, and 12C show examples of external views of various electronic equipment.

For example, FIG. 11A shows an internal block diagram of a printer that is one of such electronic equipment, and FIG. 12A shows an external view of the same. A CPU (microcomputer) 510 controls the system as a whole. An operating section 511 allows a user to operate the printer. Control programs, fonts, and so on are stored in a ROM 516, and a RAM 517 functions as a work area of the CPU 510. A DMAC 518 is a DMA controller for transferring data without the intervention of the CPU 510. A display panel 519 is provided to notify a user of the state of operation of the printer.

Serial printing data that have come from another device such as a personal computer through a USB are converted into parallel printing data by a data transfer control device 500. The converted parallel printing data are sent to a print processing section (printer engine) 512 by the CPU 510 or DMAC 518. The parallel printing data are subjected to a given process at the print processing section 512 and are printed on paper by a print section (device performing a data output process) 514 constituted by a print head or the like to be output.

Figure 11B:
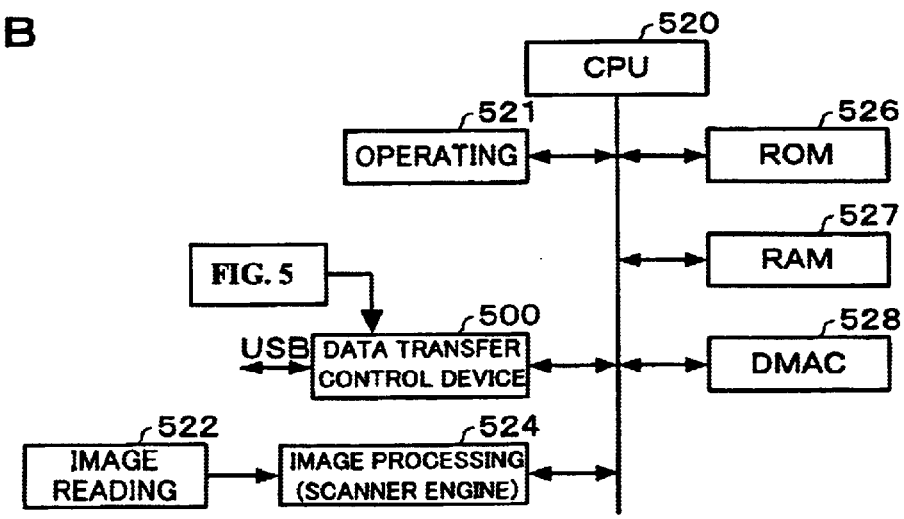
Figure 12B:
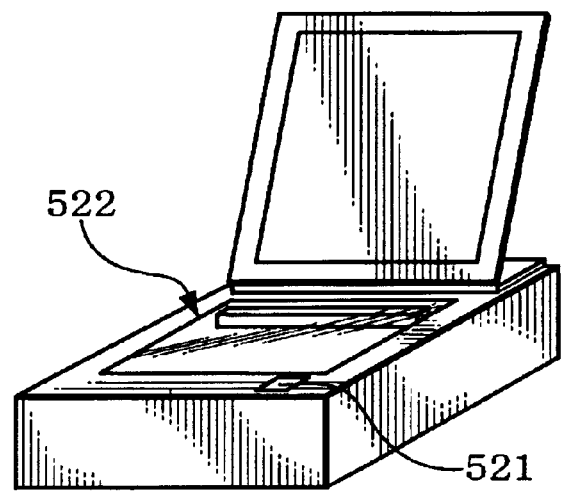

FIG. 11B shows an internal block diagram of a scanner that is one of the electronic equipment, and FIG. 12B is an external view of the same. A CPU 520 controls the system as a whole. An operating section 521 allows a user to operate the scanner. Control programs and so on are stored in a ROM 526, and a RAM 527 functions as a work area of the CPU 520. A DMAC 528 is a DMA controller.

An image of a document is read by an image reading section (a device performing a data fetching process) 522 constituted by a light source, a photoelectric converter, and so on, and data of the read image are processed by an image processing section (scanner engine) 524. The processed image data are sent to a data transfer control device 500 by the CPU 520 or DMAC 528. The data transfer control device 500 converts the parallel image data into serial data and transmits the data to another device such as a personal computer through a USB.

Figure 11C:
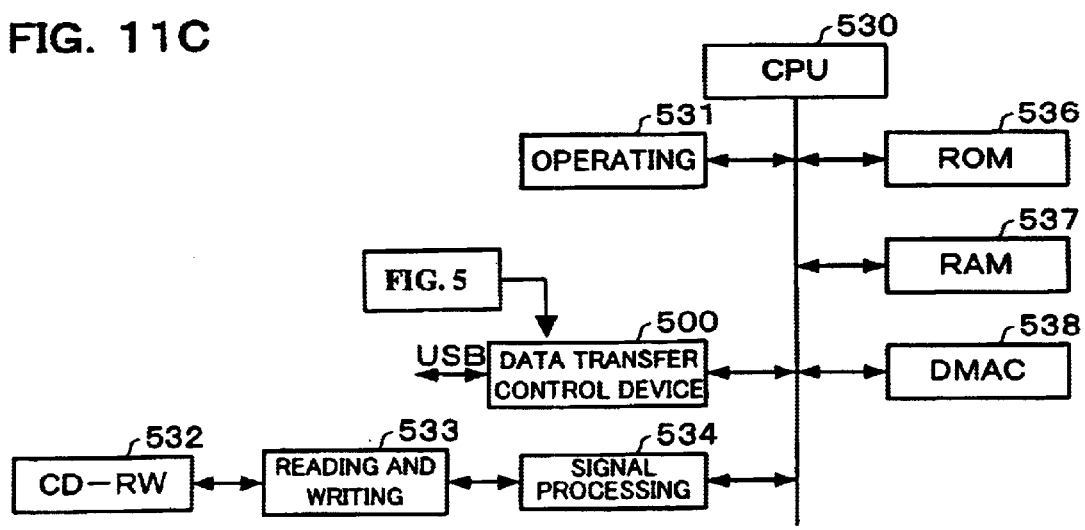
Figure 12C:
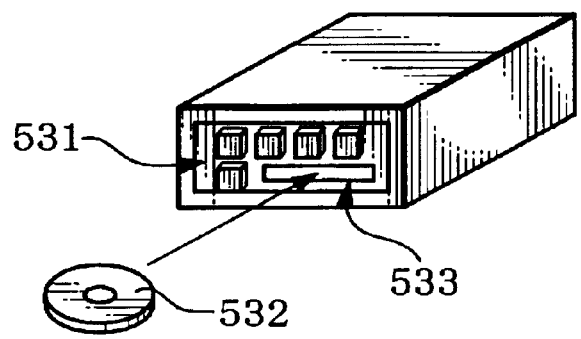

FIG. 11C shows an internal block diagram of a CD-RW drive that is one of the electronic equipment, and FIG. 12C is an external view of the same. A CPU 530 controls the system as a whole. An operating section 531 allows a user to operate the CD-RW drive. Control programs and so on are stored in a ROM 536, and a RAM 537 functions as a work area of the CPU 530. A DMAC 538 is a DMA controller.

Data read from a CD-RW 532 by a reading and writing section (a device for performing a data fetching process or a device for performing a data storing process) 533 constituted by a laser, a motor, an optical system, and so on are input to a signal processing section 534 to be subjected to given signal processes such as an error correction process. The data that has been subjected to the signal processes are sent to a data transfer control device 500 by the CPU 530 or DMAC 538. The data transfer control device 500 converts the parallel data into serial data and transmits the data to another device such as a personal computer through a USB.

Serial data that have come from another device through the USB are converted into parallel data by the data transfer control device 500. The parallel data are sent to the signal processing section 534 by the CPU 530 or DMAC 538. The parallel data are subjected to given signal processes and are stored in the CD-RW 532 by the reading and writing section 533.

Referring to FIGS. 11A, 11B, and 11C, a CPU separate from the CPU's 510, 520, and 530 may be provided for controlling data transfer by the data transfer control device 500.

The data transfer control device of the present embodiment allows data transfer in the HS mode according to USB 2.0 when used in electronic equipment. Therefore, when a user instructs printing using a personal computer or the like, printing is completed with a small time lag. After an instruction for a scanner to fetch an image, a user can take a look at the read image with a small time lag. Reading of data from a CD-RW and writing of data in a CD-RW can be performed at a high speed.

When used in electronic equipment, the data transfer control device of the present embodiment makes it possible to accurately detect reception of data transferred in the HS mode from another device connected to the bus and to achieve power saving in the electronic equipment because it can adequately control the start of a receiving process, for example.

In addition to the apparatus described above, the data transfer control device of the present embodiment can be used in various electronic equipment including various optical disk drives (CD-ROM drives and DVD drives), magneto-optical (MO) disk drives, hard disk drives, TVs, VCRs, video cameras, audio equipment, telephones, projectors, personal computers, electronic organizers, and word processors.

The invention is not limited to the embodiments described above, and various modifications can be made within the scope of the invention.

For example, the configuration of the data transfer control device of the invention is not limited to the configuration shown in FIG. 2.

The invention is not limited to data transfer according to USB 2.0, although it is especially desirable. For example, the invention may be used for data transfer according to a standard based on an idea similar to that behind USB 2.0 or a standard that is developed from USB 2.0.

What is claimed is:

1. A signal detection circuit which detects an input signal, comprising:

a peak hold circuit which holds a peak value of the input signal at a given node;

a constant potential setting circuit which returns a potential at the node to a given constant potential; and a comparison circuit which compares the potential at the node with a given reference level, wherein the signal detection circuit detects the input signal based on a comparison result by the comparison circuit.

2. A signal detection circuit which detects a differential pair of input signals, comprising:

a differential amplifier which outputs a differential pair of output signals which are amplified based on the differential pair of input signals;

first and second peak hold circuits which hold peak values of the differential pair of output signals at a given node;

a constant potential setting circuit which returns the potential at the node to a given constant potential such that the potential changes slower than a potential change caused by holding the peak values; and a comparison circuit which compares the potential at the node with a given reference level, wherein the signal detection circuit detects the input signals based on a comparison result by the comparison circuit.

3. The signal detection circuit as defined in claim 2, wherein the first and second peak hold circuits hold lower limit values of the differential pair of output signals at the given node, and wherein the constant potential setting circuit returns the potential at the node to the given constant potential by supplying charges to the node such that the potential changes slower than a potential change caused by holding the lower limit values.

4. The signal detection circuit as defined in claim 3, wherein the constant potential setting circuit comprises a constant current source which supplies small amount of charges which cause a change slower than the potential change by holding the lower limit values.

5. The signal detection circuit as defined in claim 2, wherein the differential amplifier comprises:
- a first transistor of a first conductivity type having a source terminal connected to a first power source;
- a second transistor of the first conductivity type having a source terminal connected to a drain terminal of the first transistor of the first conductivity type;
- a third transistor of the first conductivity type having a source terminal connected to the drain terminal of the first transistor of the first conductivity type;
- a first transistor of a second conductivity type having gate and drain terminals connected to a drain terminal of the second transistor of the first conductivity type and having a source terminal connected to a second power source; and
- a second transistor of the second conductivity type having gate and drain terminals connected to a drain terminal of the third transistor of the first conductivity type and having a source terminal connected to the second power source,
- wherein a given enable signal is supplied to a gate terminal of the first transistor of the first conductivity type,
- wherein the differential pair of input signals are supplied to gate terminals of the second and third transistors of the first conductivity type, and
- wherein the differential pair of output signals are output from drain terminals of the first and second transistors of the second conductivity type.

6. The signal detection circuit as defined in claim 2, wherein at least either of the first and second peak hold circuits comprises:
- a first transistor of a first conductivity type having a source terminal connected to a first power source;
- a second transistor of the first conductivity type having a source terminal connected to a drain terminal of the first transistor of the first conductivity type;
- a third transistor of the first conductivity type having a source terminal connected to the drain terminal of the first transistor of the first conductivity type;
- a first transistor of a second conductivity type having a drain terminal connected to a drain terminal of the second transistor of the first conductivity type, having a gate terminal connected to a drain terminal of the third transistor of the first conductivity type, and having a source terminal connected to a second power source;
- a second transistor of the second conductivity type having gate and drain terminals connected to the drain terminal of the third transistor of the first conductivity type and having a source terminal connected to the second power source; and
- a third transistor of the second conductivity type having a drain terminal connected to a gate terminal of the third transistor of the first conductivity type, having a gate terminal connected to the drain terminal of the first transistor of the second conductivity type, and having a source terminal connected to the second power source,
- wherein a given enable signal is supplied to a gate terminal of the first transistor of the first conductivity type,
- wherein either of the differential pair of output signals is supplied to a gate terminal of the second transistor of the first conductivity type, and
- wherein the node is connected to the gate terminal of the third transistor of the first conductivity type.

7. The signal detection circuit as defined in claim 2, wherein the comparison circuit comprises:
- a first transistor of a first conductivity type having a source terminal connected to a first power source;
- a second transistor of the first conductivity type having a source terminal connected to a drain terminal of the first transistor of the first conductivity type;
- a third transistor of the first conductivity type having a source terminal connected to the drain terminal of the first transistor of the first conductivity type;
- a first transistor of a second conductivity type having gate and drain terminals connected to a drain terminal of the second transistor of the first conductivity type and having a source terminal connected to a second power source;
- a second transistor of the second conductivity type having a drain terminal connected to a drain terminal of the third transistor of the first conductivity type, having a gate terminal connected to the gate terminal of the first transistor of the second conductivity type, and having a source terminal connected to the second power source; and
- a third transistor of the second conductivity type having a drain terminal connected to the gate terminal of the first transistor of the second conductivity type, having a gate terminal connected to the drain terminal of the second transistor of the second conductivity type, and having a source terminal connected to the second power source,
- wherein a given enable signal is supplied to a gate terminal of the first transistor of the first conductivity type,
- wherein the node is connected to a gate terminal of the second transistor of the first conductivity type,
- wherein a signal of the reference level is supplied to a gate terminal of the third transistor of the first conductivity type, and
- wherein the comparison result is output from the drain terminal of the second transistor of the second conductivity type.

8. The signal detection circuit as defined in claim 7, comprising a reference level generation circuit including:
- a fourth transistor of the first conductivity type having a source terminal connected to the first power source;
- a fifth transistor of the first conductivity type having a source terminal connected to a drain terminal of the fourth transistor of the first conductivity type;
- a sixth transistor of the first conductivity type having a source terminal connected to the drain terminal of the fourth transistor of the first conductivity type;
- a fourth transistor of the second conductivity type having gate and drain terminals connected to a drain terminal of the fifth transistor of the first conductivity type and having a source terminal connected to the second power source; and
- a fifth transistor of the second conductivity type having gate and drain terminals connected to a drain terminal of the sixth transistor of the first conductivity type and having a source terminal connected to the second power source,
- wherein a given enable signal is supplied to a gate terminal of the fourth transistor of the first conductivity type,
- wherein a differential pair of detection level signals associated with levels to be detected are respectively supplied to gate terminals of the fifth and sixth transistors of the first conductivity type, wherein a signal of the reference level is output from the drain terminal of the fifth transistor of the second conductivity type, and wherein the reference level generation circuit has electrical characteristics substantially equal to the differential amplifier.

9. The signal detection circuit as defined in claim 2, wherein the constant potential setting circuit comprises:
- a first transistor of a first conductivity type having a source terminal connected to a first power source and having a drain terminal connected to the node; and
- a capacitor inserted between the node and a second power source,
  - wherein a given enable signal is supplied to a gate terminal of the first transistor of the first conductivity type.

10. The signal detection circuit as defined in claim 2, comprising an output circuit including:
- a first transistor of a first conductivity type having a source terminal connected to a first power source; and
- a first transistor of a second conductivity type having a drain terminal connected to a drain terminal of the first transistor of the first conductivity type and having a source terminal connected to a second power source, wherein a given enable signal is supplied to a gate terminal of the first transistor of the first conductivity type, wherein an output signal from the comparison circuit is supplied to a gate terminal of the first transistor of the second conductivity type, and wherein a signal at a logical level associated with the output signal of the comparison circuit is output from the drain terminal of the first transistor of the second conductivity type.

11. The signal detection circuit as defined in claim 2, wherein the differential pair of input signals are signals in accordance with the Universal Serial Bus (USB) standard.

12. A signal detection circuit which detects a differential pair of input signals, comprising:

a differential amplifier which outputs a differential pair of output signals that is amplified based on the differential pair of input signals;

first and second peak hold circuits which hold peak values of the differential pair of output signals at a given node;

a constant potential setting circuit which returns a potential at the node to a given constant potential such that the potential changes slower than a potential change caused by holding the peak values; and a comparison circuit which compares the potential at the node with a given reference level, wherein the differential pair of input signals are signals in accordance with the Universal Serial Bus (USB) standard, wherein the first and second peak hold circuits hold lower limit values of the differential pair of output signals at the given node, wherein the constant potential setting circuit includes a constant current source which supplies small amount of charges which cause a change slower than a potential change by holding the lower limit values, wherein the potential at the node is returned to the given constant potential by supplying the charges to the node from the constant current source, and wherein the input signals are detected based on a comparison result by the comparison circuit.

13. A data transfer control device comprising:

a signal detection circuit as defined in claim 1; and a circuit which performs a given receiving process based on a signal detected by the signal detection circuit.

14. A data transfer control device comprising:

a signal detection circuit as defined in claim 2; and a circuit which performs a given receiving process based on a signal detected by the signal detection circuit.

15. A data transfer control device comprising:

a signal detection circuit as defined in claim 12; and a circuit which performs a given receiving process based on a signal detected by the signal detection circuit.

16. An electronic equipment comprising:

a data transfer control device as defined in claim 13; and a device which performs a process of outputting, fetching or storing data transferred through the data transfer control device and a bus.

17. Electronic equipment comprising:

a data transfer control device as defined in claim 14; and a device which performs a process of outputting, fetching or storing data transferred through the data transfer control device and a bus.

18. Electronic equipment comprising:

a data transfer control device as defined in claim 15; and a device which performs a process of outputting, fetching or storing data transferred through the data transfer control device and a bus.

* * * * *